(12) United States Patent
Takeuchi et al.

(10) Patent No.: US 11,029,098 B2
(45) Date of Patent: Jun. 8, 2021

(54) DEVICE TEMPERATURE REGULATOR

(71) Applicant: DENSO CORPORATION, Kariya (JP)

(72) Inventors: Masayuki Takeuchi, Kariya (JP); Yasumitsu Omi, Kariya (JP); Takashi Yamanaka, Kariya (JP); Yoshiki Kato, Kariya (JP); Takeshi Yoshinori, Kariya (JP); Koji Miura, Kariya (JP)

(73) Assignee: DENSO CORPORATION, Kariya (JP)

( * ) Notice: Subject to any disclaimer, the term of this patent is extended or adjusted under 35 U.S.C. 154(b) by 146 days.

(21) Appl. No.: 16/282,477

(22) Filed: Feb. 22, 2019

(65) Prior Publication Data

US 2019/0186843 A1 Jun. 20, 2019

Related U.S. Application Data

(63) Continuation of application No. PCT/JP2017/028053, filed on Aug. 2, 2017.

(30) Foreign Application Priority Data

Sep. 9, 2016 (JP) .............................. JP2016-176784

(51) Int. Cl.
*F28D 15/06* (2006.01)
*H01M 10/6569* (2014.01)
(Continued)

(52) U.S. Cl.
CPC .............. *F28D 15/06* (2013.01); *F28D 15/02* (2013.01); *H01M 10/613* (2015.04);
(Continued)

(58) Field of Classification Search
CPC ........ F28D 1/0226; F28D 15/02; F28D 15/06; F28D 15/0266; H01M 10/613;
(Continued)

(56) References Cited

U.S. PATENT DOCUMENTS

| 4,986,348 A * | 1/1991 | Okayasu ................. F28D 15/06 165/104.22 |
| 5,203,399 A * | 4/1993 | Koizumi ............. F28D 15/0266 165/104.22 |
| 5,816,313 A * | 10/1998 | Baker ................... F28D 15/043 165/41 |
| 10,605,541 B1 * | 3/2020 | Zheng ..................... F28D 15/06 |
| 2005/0279491 A1 * | 12/2005 | Thome ................ F28D 15/0266 165/272 |

(Continued)

FOREIGN PATENT DOCUMENTS

| JP | 2013032904 A | 2/2013 |
| JP | 2015041418 A | 3/2015 |

(Continued)

OTHER PUBLICATIONS

U.S. Appl. No. 16/330,440, filed Mar. 5, 2019, Yoshinori et al.

*Primary Examiner* — Eric S Ruppert
*Assistant Examiner* — Hans R Weiland
(74) *Attorney, Agent, or Firm* — Harness, Dickey & Pierce, P.L.C.

(57) ABSTRACT

A device temperature regulator includes a forward passage in which a forward flow passage is formed to cause a working fluid to flow to a heat absorber from a heat radiator, and a backward passage in which a backward flow passage is formed to cause the working fluid to flow to the heat radiator from the heat absorber. In addition, the device temperature regulator includes a bubble generator, which generates a bubble in the working fluid collecting in the heat absorber and having a liquid phase, and a controller that causes the bubble generator to generate the bubble in a precondition is satisfied.

20 Claims, 10 Drawing Sheets

(51) Int. Cl.
- *H01M 10/613* (2014.01)
- *H01M 10/633* (2014.01)
- *H05K 7/20* (2006.01)
- *H01M 10/625* (2014.01)
- *H01M 10/647* (2014.01)
- *H01M 10/6556* (2014.01)
- *H01M 10/652* (2014.01)
- *F28D 15/02* (2006.01)
- *H01M 10/63* (2014.01)
- *B60H 1/00* (2006.01)

(52) U.S. Cl.
CPC ......... *H01M 10/625* (2015.04); *H01M 10/63* (2015.04); *H01M 10/633* (2015.04); *H01M 10/647* (2015.04); *H01M 10/652* (2015.04); *H01M 10/6556* (2015.04); *H01M 10/6569* (2015.04); *H05K 7/20* (2013.01); *B60H 2001/00307* (2013.01); *H01M 2220/20* (2013.01)

(58) Field of Classification Search
CPC ............... H01M 10/63; H01M 10/633; H01M 10/6556; H01M 10/6569; H01M 10/652; H01M 2200/20; H05K 7/20; B60H 2001/00307; Y02E 60/10
See application file for complete search history.

(56) References Cited

U.S. PATENT DOCUMENTS

| | | | |
|---|---|---|---|
| 2015/0114605 A1* | 4/2015 | Dupont | F28D 15/06 165/104.26 |
| 2016/0204488 A1* | 7/2016 | Arai | H01M 10/6569 429/62 |
| 2019/0184852 A1 | 6/2019 | Takeuchi et al. | |
| 2019/0190102 A1 | 6/2019 | Miura et al. | |
| 2019/0193213 A1 | 6/2019 | Omi et al. | |
| 2019/0198954 A1 | 6/2019 | Miura et al. | |
| 2019/0204014 A1 | 7/2019 | Yoshinori et al. | |

FOREIGN PATENT DOCUMENTS

| | | |
|---|---|---|
| WO | WO-2018047528 A1 | 3/2018 |
| WO | WO-2018047530 A1 | 3/2018 |
| WO | WO-2018047531 A1 | 3/2018 |
| WO | WO-2018047532 A1 | 3/2018 |
| WO | WO-2018047533 A1 | 3/2018 |
| WO | WO-2018047534 A1 | 3/2018 |
| WO | WO-2018047535 A1 | 3/2018 |
| WO | WO-2018047536 A1 | 3/2018 |
| WO | WO-2018047537 A1 | 3/2018 |
| WO | WO-2018047538 A1 | 3/2018 |
| WO | WO-2018047539 A1 | 3/2018 |
| WO | WO-2018047540 A1 | 3/2018 |

\* cited by examiner

DEVICE TEMPERATURE REGULATOR

CROSS REFERENCE TO RELATED APPLICATIONS

The present application is a continuation application of International Patent Application No. PCT/JP2017/028053 filed on Aug. 2, 2017, which designated the United States and claims the benefit of priority from Japanese Patent Application No. 2016-176784 filed on Sep. 9, 2016. The entire disclosures of all of the above applications are incorporated herein by reference.

TECHNICAL FIELD

The present disclosure relates to a device temperature regulator that regulates a temperature of a target device.

BACKGROUND

A battery temperature regulator is provided with a heating medium cooling part as a thermosiphon condenser and a temperature regulating part as a battery cooler. Then, the heating medium cooling part and the temperature regulating part are annularly connected to each other by a pipe, so that the battery temperature regulator is configured in such a way that a heating medium circulates between the heating medium cooling part and the temperature regulating part.

For example, the temperature regulating part is arranged so as to be in contact with side surfaces of a plurality of battery cells to configure a battery and regulates a temperature of the battery by a phase change between a liquid phase and a gas phase of the heating medium.

SUMMARY

The present disclosure provides a device temperature regulator in which a working fluid circulates by a phase change between a liquid phase and a gas phase of the working fluid. The device temperature regulator includes a heat absorber that causes the working fluid to absorb heat from the target device so as to evaporate the working fluid, a heat radiator that is arranged above the heat absorber and that causes the working fluid to radiate heat so as to condense the working fluid, a forward passage in which a forward flow passage is formed, the forward flow passage causing the working fluid to flow to the heat absorber from the heat radiator, a backward passage in which a backward flow passage is formed, the backward flow passage causing the working fluid to flow to the heat radiator from the heat absorber, a bubble generator that generates a bubble in the working fluid collecting in the heat absorber and having the liquid phase, and a controller configured to cause the bubble generator to generate the bubble.

DESCRIPTION OF EMBODIMENTS

Figure 1:
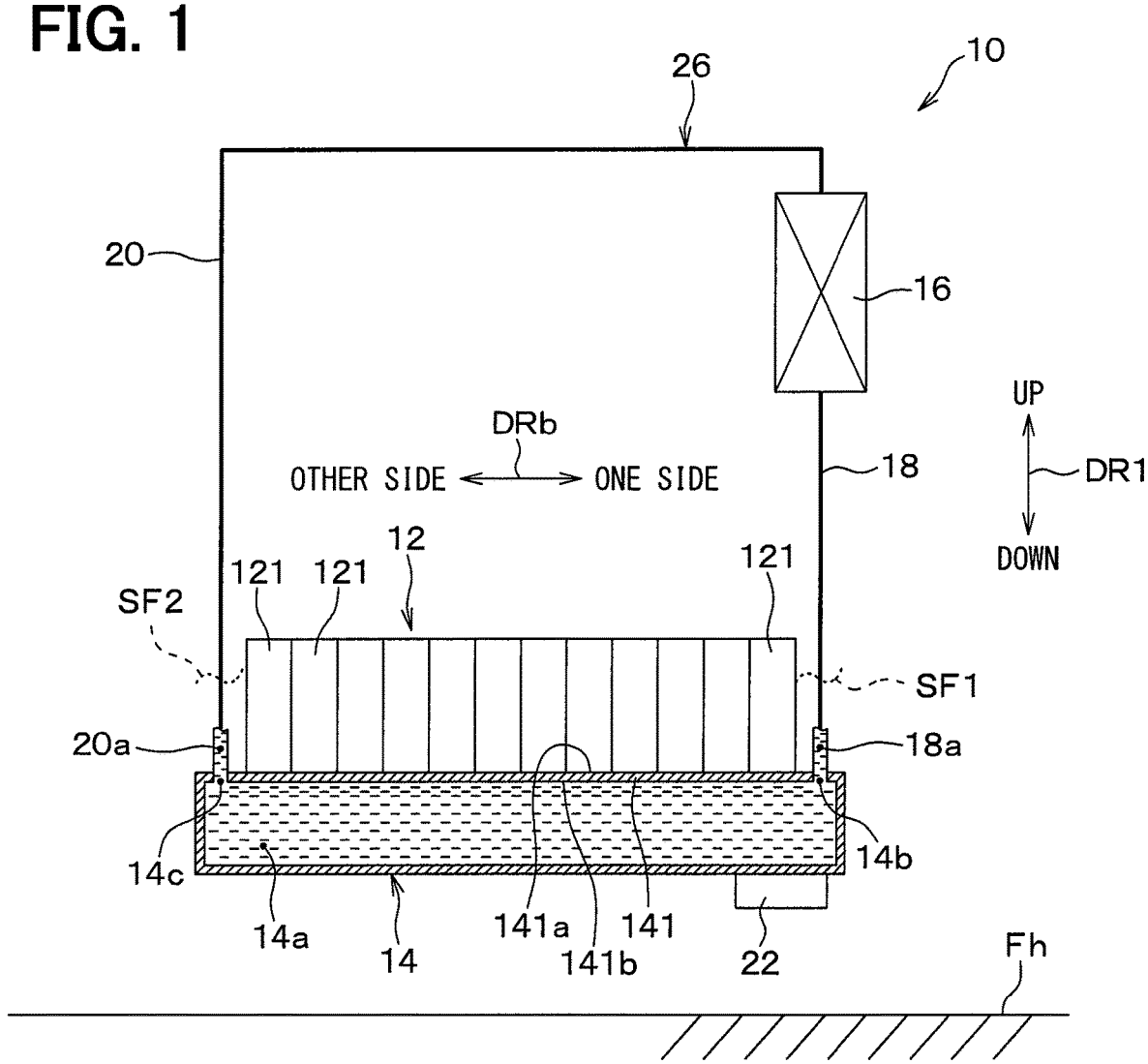
FIG. 1 is a schematic diagram to show a general configuration of a device temperature regulator in a first embodiment and is a diagram to show a case where a vehicle is in a vehicle horizontal state and where a refrigerant does not circulate.

In a battery temperature regulator employing a thermosiphon system, if a temperature difference between a battery temperature and a temperature of a heating medium cooling part becomes large, a thermosiphon to circulate the heating medium is activated, and thereby a cooling of the battery is started.

However, there is a case where the thermosiphon needs to be positively activated without waiting for the temperature difference to be expanded. For example, in a case where a liquid surface in the temperature regulating part is leaned by an inclination of a vehicle mounted with the battery temperature regulator, it is preferable that the thermosiphon is positively activated. This is because a portion richer in a liquid phase of the heating medium of a gas-liquid phase in the temperature regulating part gives and receives heat more easily, so when the liquid surface is continuously leaned, respective battery cells cause variations in the temperature.

As another example, it is thought that the thermosiphon is not activated in a state where an increase in the battery temperature is moderate. Even in this case, it is desired that the thermosiphon is positively activated. As the result of a detailed study conducted by the inventors of the present disclosure, the abovementioned fact was found.

In view of the abovementioned matters, the present disclosure is to provide a device temperature regulator capable of appropriately activating a cooling of a target device by a thermosiphon system.

Hereinafter, embodiments of the present disclosure will be described with reference to the drawings. In the respective embodiments below, the same or equivalent parts will be denoted by the same reference characters.

First Embodiment

A device temperature regulator 10 of the present embodiment shown in FIG. 1 is mounted on an electrically-driven vehicle such as an electric vehicle or a hybrid vehicle. Then, in the present embodiment, the device temperature regulator 10 functions as a cooling device for cooling a secondary battery 12 (hereinafter, simply also referred to as "a battery 12") mounted on the electrically-driven vehicle. In other words, a target device that the device temperature regulator 10 cools is the battery 12.

In the electrically-driven vehicle (hereinafter, simply also referred to as "a vehicle") mounted with the device temperature regulator 10, an electric energy stored in an electrical storage device (in other words, a battery pack) including the secondary battery 12 as a main constituent part is supplied to a motor via an inverter or the like, and thereby the vehicle travels. The battery 12 is self-heated while the vehicle is traveling, that is, vehicle is being used. When the battery 12 becomes an excessively high temperature, the deterioration of a battery cell 121 configuring the battery 12 is accelerated, so an output and an input of the battery cell 121 need to be limited so as to reduce self-heating. For this reason, in order to secure the output and the input of the battery cell 121, a cooling device for holding the battery 12 at a specified temperature or less is required.

Further, a battery temperature will be increased not only while the vehicle is travelling but also while the vehicle is parking and is left unattended in the summer. Still further, the electrical storage device is arranged under a floor or a trunk room of the vehicle in many cases. Thus, although the amount of heat per unit time given to the battery 12 is small, when the battery 12 is left neglected for a long time, the battery temperature is gradually increased. When the battery 12 is left neglected in a high-temperature state, a lifetime of the battery 12 is greatly decreased, so it is desired that even while the vehicle is left unattended, the battery temperature is held at low temperatures by cooling the battery 12 or the like.

Still further, the battery 12 is configured as a battery pack including the plurality of battery cells 121, but in a case where the respective battery cells 121 are varied in temperature, the battery cells 121 are unevenly impaired, which hence reduces the performance of the electrical storage device. This is because the input and output characteristics of the electrical storage device are determined in accordance with the characteristics of the most impaired battery cell 121. For this reason, in order to cause the electrical storage device to exhibit a desired performance for a long period, it is important to reduce variations in temperature among the plurality of battery cells 121, that is, to equalize the temperatures of the plurality of battery cells 121.

Further, air blowing by a blower, and air cooling, water cooling, or refrigerant direct cooling system using a refrigeration cycle have been generally used as other cooling device for cooling the battery 12. However, the air blowing by the blower only sends air in a vehicle compartment and hence a cooling capacity of the blower is low. Still further, in the air blowing by the blower, the battery 12 is cooled by a sensible heat of the air, so that a temperature difference between on an upstream side and on a downstream side of an air flow becomes large and hence variations in the temperature between the battery cells 121 cannot be sufficiently suppressed. Still further, in the system using the refrigeration cycle, a cooling capacity is high but a heat exchange part of the battery cells 121 is cooled by a sensible heat in the air cooling system or water cooling system, so that variations in the temperature among the battery cells 12 cannot be sufficiently inhibited. Still further, an operation of driving a compressor or a cooling fan of the refrigeration cycle while the vehicle is parking and is left unattended increases a power consumption or causes noises, which hence is not preferable.

From this kind of circumstance, the device temperature regulator 10 of the present embodiment employs a thermosiphon system that cools the battery 12 by natural circulation of the refrigerant without using a compressor.

Figure 2:
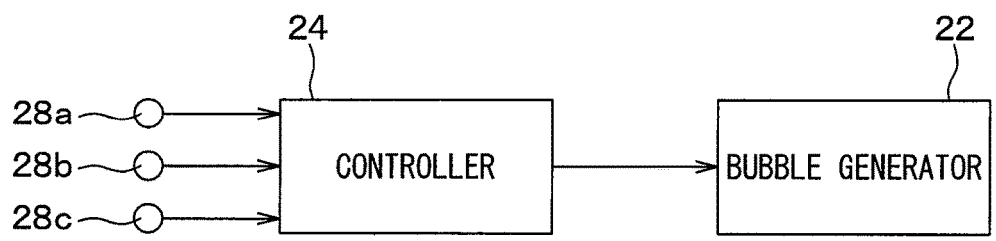
FIG. 2 is a block diagram to show an electric connection of a controller included by the device temperature regulator in the first embodiment.

Specifically, the device temperature regulator 10, as shown in FIG. 1, is provided with a battery cooler 14, a condenser 16, a forward pipe 18 as a forward passage, a backward pipe 20 as a backward passage, a bubble generator 22 as a bubble generator, and a controller 24 (see FIG. 2). Then, the condenser 16, the forward pipe 18, the battery cooler 14, and the backward pipe 20 are annularly coupled to each other to configure a fluid circulation circuit 26 in which the refrigerant as a working fluid of the device temperature regulator 10 circulates.

In other words, the fluid circulation circuit 26 is a heat pipe that transfers heat by the evaporation and the condensation of the refrigerant. The fluid circulation circuit 26 is configured so as to form a loop type thermosiphon (in other words, a thermosiphon circuit) in which a flow passage in which a gaseous refrigerant flows is separated from a flow passage in which a liquid refrigerant flows. In FIG. 1, the battery cooler 14 and portions in which the respective pipes 18, 20 are connected to the battery cooler 14 are shown in a section view. This is the same also in FIGS. 3, 5, 7 to 10. Further, an arrow DR1 shown in FIG. 1 shows a direction of the vehicle provided with the device temperature regulator 10. In other words, the arrow DR1 shows an up-and-down direction of the vehicle.

The fluid circulation circuit 26 has the refrigerant filled and enclosed therein. The interior of the fluid circulation circuit 26 is filled with the refrigerant. The refrigerant circulates in the fluid circulation circuit 26 and the device temperature regulator 10 regulates the temperature of the battery 12 by a phase change between a liquid phase and a gas phase of the refrigerant. In more details, the device temperature regulator 10 cools the battery 12 by the phase change of the refrigerant.

The refrigerant filled in the fluid circulation circuit 26 is, for example, a fluorocarbon refrigerant such as HFO-1234yf or HFC-134a.

As shown in FIG. 1, the battery cooler 14 of the device temperature regulator 10 is a heat absorber that causes the refrigerant to absorb heat from the battery 12. In other words, the battery cooler 14 transfers heat to the refrigerant from the battery 12, thereby cooling the battery 12. The battery 14 is made of, for example, a metal having a high thermal conductivity.

In more details, the battery cooler 14 has a cooling chamber 14a formed therein, the cooling chamber 14a having a liquid-phase refrigerant collected therein. Then, the battery cooler 14 causes the refrigerant in the cooling chamber 14a to absorb heat from the battery 12, thereby evaporating the refrigerant.

Further, the battery 12 cooled by the battery cooler 14 includes a plurality of battery cells 121 electrically connected to each other in series. The plurality of battery cells 121 are stacked in a battery stacking direction DRb, and the battery stacking direction DRb becomes a direction along a horizontal plane Fh in a vehicle horizontal state in which the vehicle is arranged horizontally. The horizontal plane Fh is an imaginary plane expanding in a horizontal direction.

The battery cooler 14 forms, for example, a box shaped like a rectangular parallelepiped and is formed so as to extend in the battery stacking direction DRb. Further, the battery cooler 14 has an upper surface part 141 in which an upper surface 141a of the battery cooler 14 is formed. In other words, the upper surface part 141 has an upper inside wall surface 141b formed on a side opposite to the upper surface 141a side thereof, the upper inside wall surface 141b forming an upper side of the cooling chamber 14a.

Figure 5:
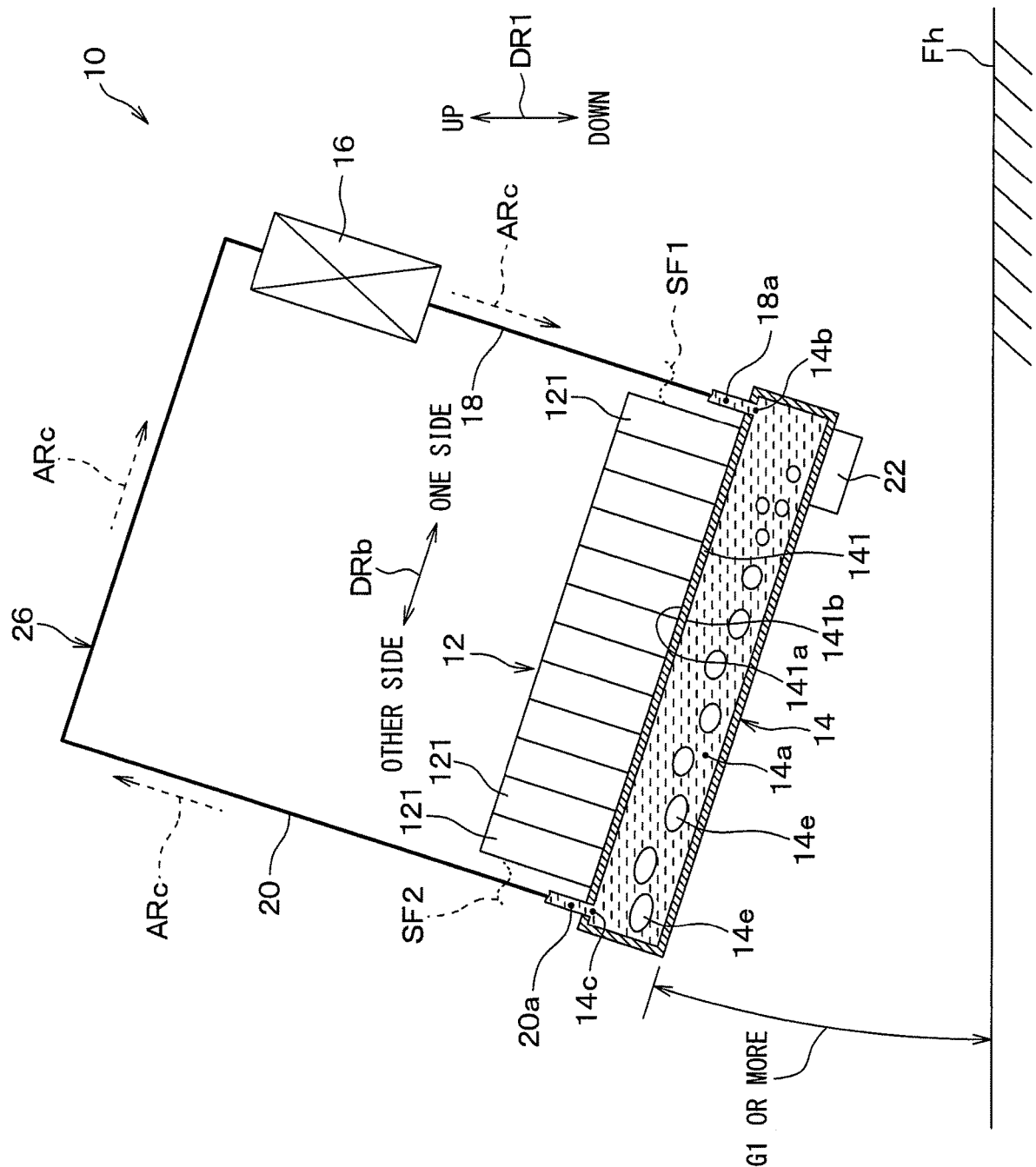
FIG. 5 is a schematic diagram to show a state where a bubble generator included by the device temperature regulator of the first embodiment generates bubbles in a state where the vehicle is inclined with respect to the vehicle horizontal state.

The amount of the refrigerant filled in the fluid circulation circuit 26 is the amount of the liquid-phase refrigerant which fills the cooling chamber 14a when the liquid-phase refrigerant collected in the cooling chamber 14a does not include bubbles 14e (see FIG. 5). For this reason, a liquid surface of the liquid-phase refrigerant is formed in the forward pipe 18 and in the backward pipe 20 and is located above the upper inside wall surface 141b of the battery cooler 14. In FIG. 1, a liquid surface position SF1 of the liquid-phase refrigerant in the forward pipe 18 is shown by a broken line SF1 and a liquid surface position SF2 of the liquid-phase refrigerant in the backward pipe 20 is shown by a broken line SF2.

The plurality of battery cells 121 are arranged side by side on the upper surface 141a of the battery cooler 14. The plurality of battery cells 121 are connected to the upper surface part 141 respectively so as to be able to transfer heat between the battery cells 121 and the upper surface part 141 of the battery cooler 14. In this way, the upper surface 141a of the battery cooler 14 functions as a battery cooling surface to cool the battery 12 and the upper surface part 141 of the battery cooler 14 functions as a cooling surface forming part to form the battery cooling surface.

The battery cooler 14 has an inflow port 14b and an outflow port 14c formed therein. The inflow port 14b causes the forward flow passage 18a formed in the forward pipe 18 to communicate with an interior of the battery cooler 14 (that is, the cooling chamber 14a). Thus, when the refrigerant circulates in the fluid circulation circuit 26, the refrigerant in the forward flow passage 18a flows into the cooling chamber 14a through the inflow port 14b of the battery cooler 14. The forward flow passage 18a is a refrigerant flow passage which causes the refrigerant to flow to the battery cooler 14 from the condenser 16. The inflow port 14b of the battery cooler 14 is provided, for example, at an end portion on one side of the battery cooler 14 in the battery stacking direction DRb.

Further, the outflow port 14c of the battery cooler 14 causes a backward flow passage 20a formed in the backward pipe 20 to communicate with the interior of the battery cooler 14. Thus, when the refrigerant circulates in the fluid circulation circuit 26, the refrigerant in the cooling chamber 14a flows out to the backward flow passage 20a through the outflow port 14c of the battery cooler 14. The backward flow passage 20a is a refrigerant flow passage which causes the refrigerant to flow to the condenser 16 from the battery cooler 14. The outflow port 14c of the battery cooler 14 is provided, for example, at an end portion on the other side of the battery cooler 14 in the battery stacking direction DRb. Here, the battery cooler 14 has a structure (not shown in the figure) to cause the gas-phase refrigerant in the cooling chamber 14a to flow out solely from the outflow port 14c of the inflow port 14b and the outflow port 14c.

The condenser 16 of the device temperature regulator 10 is a heat radiator which radiates heat to a heat receiving fluid from the refrigerant in the condenser 16. In more details, the gas-phase refrigerant flows into the condenser 16 from the backward pipe 20, and the condenser 16 causes the refrigerant to radiate heat, thereby condensing the refrigerant. The heat receiving fluid which is caused to exchange heat with the refrigerant in the condenser 16 is, for example, air or water.

Further, the condenser 16 is arranged above the battery cooler 14. Then, the forward pipe 18 is connected to a lower portion of the condenser 16 and the backward pipe 20 is connected to an upper portion of the condenser 16. In short, the forward pipe 18 is connected to the condenser 16 at a portion lower than the backward pipe 20. For this reason, the refrigerant condensed in the condenser 16, that is, the liquid-phase refrigerant in the condenser 16 flows from inside the condenser 16 to the forward flow passage 18a by the gravity.

The bubble generator 22 generates bubbles 14e (see FIG. 5) in the liquid-phase refrigerant collected in the cooling chamber 14a in accordance with a control of the controller 24. The bubbles 14e are bubbles of the gas-phase refrigerant (in other words, a gas refrigerant). Specifically, the bubble generator 22 is a heating source to generate heat, for example, an electric heater and an on/off operation of generating heat of the bubble generator 22 is turned on/off by the controller 24. Thus, the bubble generator 22 heats and boils the liquid-phase refrigerant to thereby generate bubbles 14e in the liquid-phase refrigerant. Here, in FIG. 1, the device temperature regulator 10 is shown in a state where the on/off operation of generating heat of the bubble generator 22 is turned off.

Further, the bubble generator 22 is provided on the outside of the battery cooler 14 and is coupled to, for example, a wall of a lower portion of the battery cooler 14. The bubble generator 22 is fixed to the wall of the battery cooler 14 so as to be able to transfer heat and heats the refrigerant in the cooling chamber 14a via the wall. Further, the bubble generator 22 is arranged at a position closer to the inflow port 14b than the outflow port 14c of the battery cooler 14.

The controller 24 shown in FIG. 2 is an electronic controller configured of a publicly known microcomputer including a CPU, a ROM, a RAM, and the like and its peripheral circuit. The controller 24 performs various kinds of control processing according to a computer program previously stored in the ROM or the like.

In other words, the controller 24 executes the computer program stored in a non-transitive substantial storage medium such as ROM. When the computer program is executed, a method corresponding to the computer program is performed.

Further, as shown in FIG. 2, the controller 24 has detection signals inputted one after another from various kinds of sensors 28a, 28b, 28c provided in the secondary battery 12 or the device temperature regulator 10. For example, the device temperature regulator 10 is provided with a flow rate sensor 28a arranged in the forward flow passage 18a or in the backward flow passage 20a and for detecting a flow rate of the refrigerant. The controller 24 has a detection signal inputted from the flow rate sensor 28a, the detection signal indicating a circulation flow rate of the refrigerant circulating in the fluid circulation circuit 26.

Still further, each of the plurality of battery cells 121 is provided with a battery cell temperature sensor 28b. A detection signal to indicate a temperature of each battery cell 121 (that is, a battery cell temperature) is inputted to the controller 24 from each battery cell temperature sensor 28b. Further, a detection signal to indicate an inclination angle of the vehicle is inputted to the controller 24 from an inclination sensor 28c included by the vehicle.

Still further, the controller 24 outputs various kinds of control signals to respective control instruments to thereby control the respective control instruments. For example, the controller 24 performs a control of turning on/off the bubble generator 22 that is one of the control instruments.

In the device temperature regulator 10 configured in the above-mentioned manner and shown in FIG. 1, when the battery 12 generates heat and a battery temperature increases, for example, while the vehicle is travelling, heat is transferred to the upper surface part 141 of the battery cooler 14 though a lower surface of the battery cell 121 and the liquid-phase refrigerant in the battery cooler 14 is boiled by the heat. Each battery cell 121 is cooled by a latent heat of evaporation caused by the liquid-phase refrigerant being boiled. The refrigerant boiled in the battery cooler 14 is gasified and is moved upward. In other words, the gasified refrigerant (that is, gas-phase refrigerant) is moved to the condenser 16 through the backward flow passage 20a. Then, the gas-phase refrigerant flowing into the condenser 16 is cooled and liquefied in the condenser 16 and again flows into the battery cooler 14 through the forward pipe 18. In the device temperature regulator 10, these operations are performed by the natural circulation of the refrigerant filled in the fluid circulation circuit 26 without using a driving device such as a compressor.

In a scene where the battery does not generate heat, for example, while the vehicle is left unattended, for example, by filling the liquid-phase refrigerant in the battery cooler 14 as shown in FIG. 1, the temperatures of the respective battery cells 121 can be equalized. This is caused by an operation in which only the liquid-phase refrigerant near the battery cells 121 having high temperatures of the battery 12 is evaporated. In order for this temperature equalization of the battery cells 121 to be automatically performed, the liquid-phase refrigerant needs to be in contact with the upper inside wall surface 141b over the entire range in which all battery cells 121 of the upper surface part 141 of the battery cooler 14 are placed.

Figure 3:
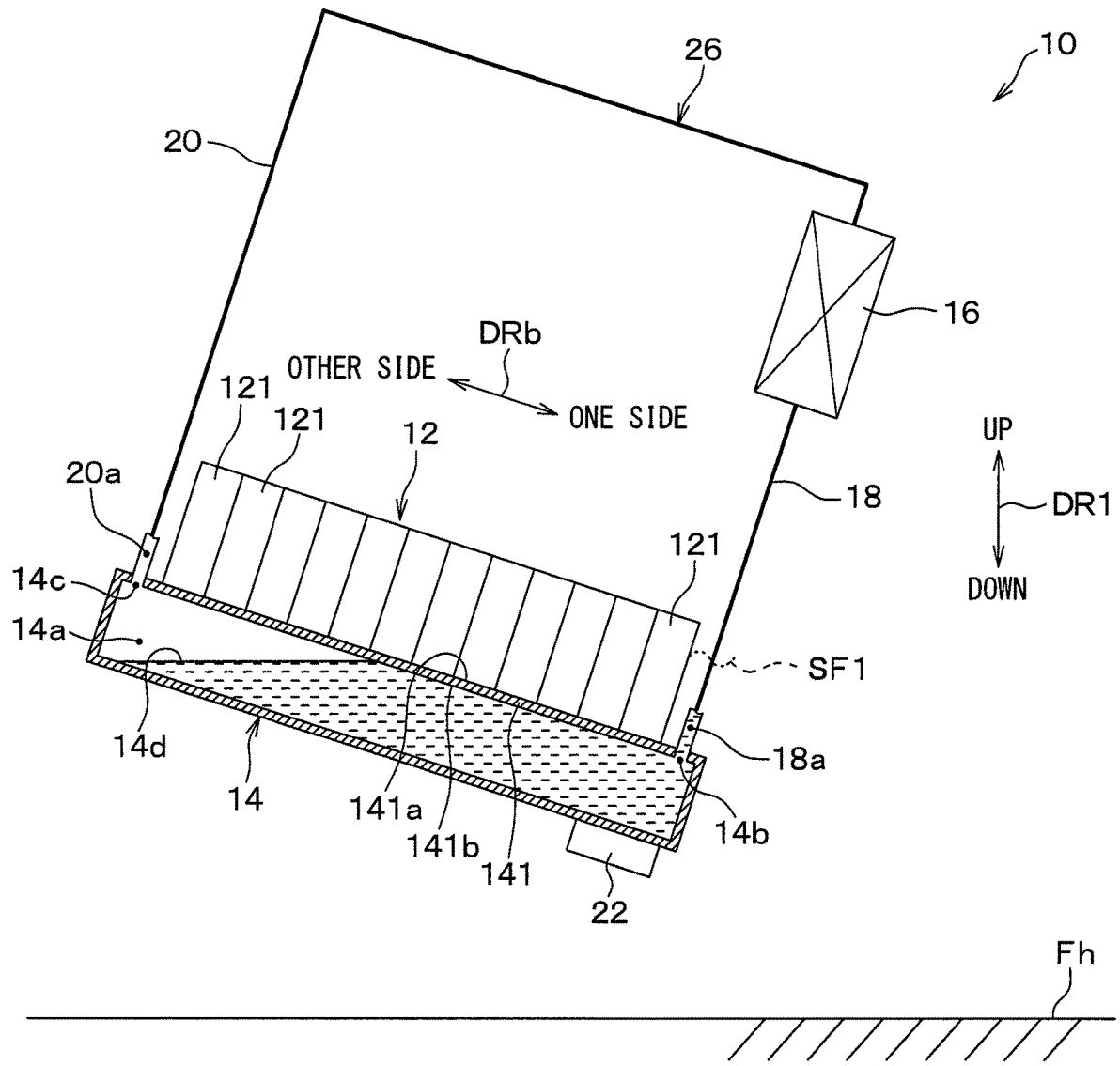
FIG. 3 is a schematic diagram to show the general configuration of the device temperature regulator in FIG. 1 and is a diagram to show a case where the vehicle is inclined with respect to the vehicle horizontal state and where the refrigerant does not circulate.

However, the battery 12 is mounted on the vehicle, in a case where the vehicle is inclined, for example, the vehicle parks on a slope, if the refrigerant is not circulated but is left unattended with the refrigerant collected in the cooling chamber 14a as shown in FIG. 3, it is though that the surface 14d of the refrigerant in the battery cooler 14 is leaned.

In a case where the surface 14d of the refrigerant in the battery cooler 14 is leaned as shown in FIG. 3, a liquid noncontact portion which is not in contact with the liquid-phase refrigerant is caused in the upper surface part 141 of the battery cooler 14. Then, the battery cells 121 above the liquid noncontact portion don't easily exchange heat with the refrigerant in the cooling chamber 14a, which hence increases a difference in the battery cell temperature between the battery cells 121 above the liquid noncontact portion and the battery cells 121 of the other portion. At this time, when the refrigerant once starts boiling in the cooling chamber 14a, the refrigerant is circulated in the fluid circulation circuit 26 and hence the respective battery cells 121 can have their temperatures equalized and can be cooled.

However, in order for the refrigerant in the cooling chamber 14a to naturally start boiling, each battery cell temperature needs to be higher by a certain temperature difference with respect to a temperature of the outside air (that is, air outside the vehicle compartment) of a heat receiving fluid. In other words, in a case where it is waited that the refrigerant in the cooling chamber 14a starts boiling with the liquid surface 14d leaned in the cooling chamber 14a as shown in FIG. 3, a decrease in performance or a deterioration of the battery 12 will be brought about by variations in temperature among the battery cells 121.

Further, it can also be thought that the amount of refrigerant filled in the cooling chamber 14a is increased in such a way that the liquid-phase refrigerant is in contact with the whole of the upper inside wall surface 141b in the cooling chamber 14a even if the vehicle is inclined, but this is not practical. The reason is that this causes other following matters: for example, the device temperature regulator 10 is increased in weight; and when the temperature is increased, an internal pressure of the fluid circulation circuit 26 is increased and hence the heat exchangers 14, 16 and the pipes 18, 20 need to have their pressure tightness increased.

Figure 4:
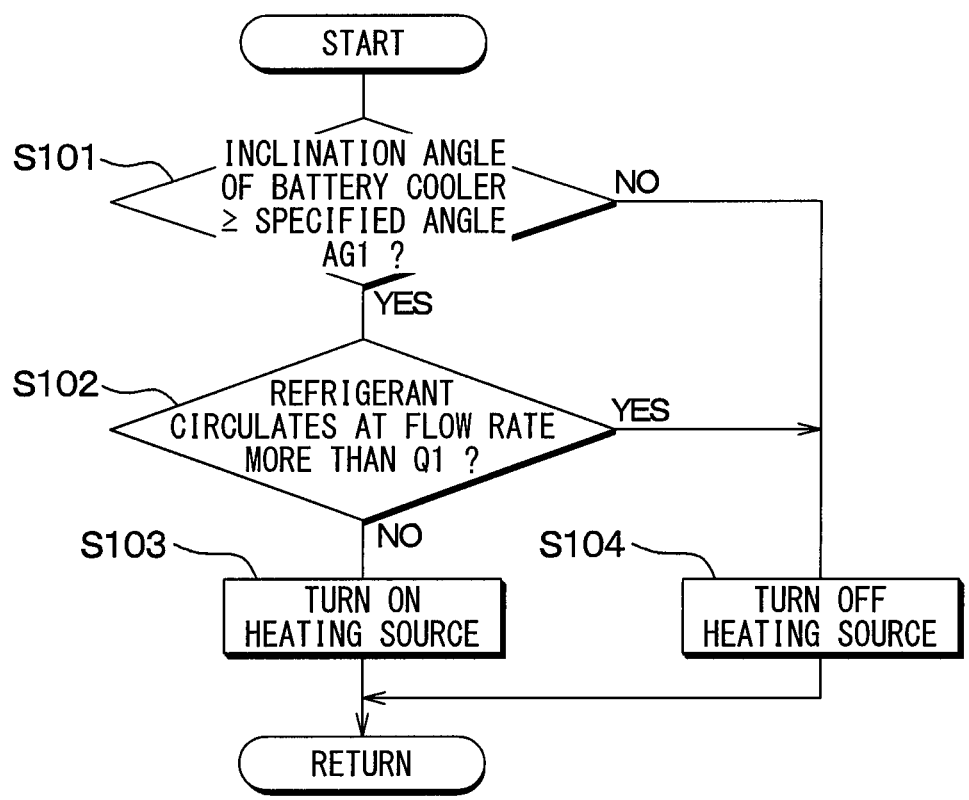
FIG. 4 is a flow chart to show control processing of the controller included by the device temperature regulator of the first embodiment.

Thus, the controller 24 of the present embodiment performs control processing shown in FIG. 4. FIG. 4 is a flow chart to show the control processing to be performed by the controller 24 of the present embodiment. The controller 24 performs the control processing shown in FIG. 4 cyclically repeatedly, for example, regardless of whether an ignition switch of the vehicle is turned on or off.

As shown in FIG. 4, the controller 24 determines first in step S101 whether or not the battery cooler 14 is inclined by a specified angle AG1 or more with respect to a predetermined reference posture. It is a predetermined precondition for turning on the bubble generator 22 that the battery cooler 14 is inclined by the specified angle AG1 or more with respect to the reference posture. In other words, a case where the precondition is satisfied is a case where the battery cooler 14 is inclined by the specified angle AG1 or more with respect to the reference posture. The specified angle AG1 is determined experimentally in advance so as to be able to determine that the battery cooler 14 is brought into a posture (in other words, a direction) in which the liquid surface 14d of the refrigerant is leaned in the cooling chamber 14a.

For example, in a case where the liquid surface 14d of the refrigerant is formed in the cooling chamber 14a as shown in FIG. 3, the controller 24 determines that the battery cooler 14 is inclined by the specified angle AG1 or more with respect to the reference posture described above. In other words, when the liquid surface 14d is formed in the battery cooler 14 and the refrigerant in a portion on an upstream side of the battery cooler 14 with the liquid surface 14d as a borderline is the liquid phase and the refrigerant in a portion on a downstream side is the gas phase, the controller 24 determines that the battery cooler 14 is inclined by the specified angle AG1 or more with respect to the reference posture.

Here, the reference posture of the battery cooler 14 is a posture of the battery cooler 14 shown in FIG. 1. In other words, the battery cooler 14 is set so as to be inclined integrally with the vehicle and the reference posture of the battery cooler 14 is a posture of the battery cooler 14 when the vehicle is in the vehicle horizontal state. In the reference posture of the battery cooler 14, if the liquid-phase refrigerant collected in the cooling chamber 14a does not include bubbles 14e (see FIG. 5) as shown in FIG. 1, the cooling chamber 14a is filled with the liquid-phase refrigerant.

In order to make a determination of step S101, the controller 24 obtains an inclination angle of the vehicle with respect to a horizontal plane Fh from the inclination sensor 28c included by the vehicle. Then, the battery cooler 14 is inclined integrally with the vehicle, so the controller 24 considers the inclination angle of the vehicle as an inclination angle with respect to the reference posture of the battery cooler 14. Thus, in a case where the inclination angle of the vehicle is the specified angle AG1 or more, the controller 24 determines that the battery cooler 14 is inclined by the specified angle AG1 or more with respect to the reference posture determined in advance.

In a case where it is determined in step S101 shown in FIG. 4 that the battery cooler 14 is inclined by the specified angle AG1 or more with respect to the reference posture, the procedure proceeds to step S102. On the other hand, in a case where it is determined that an inclination angle of the battery cooler 14 with respect to the reference posture is less than the specified angle AG1, the procedure proceeds to step S104.

In the determination in step S101, there is no plus or minus in a direction of the inclination of the battery cooler 14. In other words, the same determination is made for an inclination in which one side of the battery stacking direction DRb of the battery cooler 14 is positioned above the other side and an inclination in which one side of the battery stacking direction DRb of the battery cooler 14 is positioned below the other side.

In step S102, the controller 24 determines whether or not the circulation flow rate of the refrigerant circulated in the fluid circulation circuit 26 is more than a specified flow rate Q1. In short, the controller 24 determines whether or not a thermosiphon phenomenon is caused in the device temperature regulator 10. The thermosiphon phenomenon is a phenomenon such that the refrigerant is circulated by the evaporation and the condensation of the refrigerant to thereby transfer heat from the battery 12 to the heat receiving fluid (for example, outside air) in the condenser 16. Thus, the specified flow rate Q1 is determined experimentally in advance so as to be able to determine that the thermosiphon phenomenon is caused, and is set to, for example, a positive value close to zero or zero. The circulation flow rate of the refrigerant determined in step S102 is a mass flow rate. Further, the controller 24 obtains the circulation flow rate of the refrigerant from the flow rate sensor 28a shown in FIG. 2.

In a case where it is determined in step S102 that the thermosiphon phenomenon is caused, that is, the circulation flow rate of the refrigerant is more than the specified flow rate Q1, the procedure proceeds to step S104. On the other hand, in a case where the thermosiphon phenomenon is at a standstill, that is, the circulation flow rate of the refrigerant is the specified flow rate Q1 or less, the procedure proceeds to step S103.

In step S103, the controller 24 causes the bubble generator 22 to generate bubbles 14e as shown in FIG. 5. Further, in a case where the bubble generator 22 is already generating the bubbles 14e, the controller 24 causes the bubble generator 22 to continuously generate the bubbles 14e.

Specifically, the bubble generator 22 is a heating source, so the controller 24 turns on the bubble generator 22 to cause the bubble generator 22 to heat the liquid-phase refrigerant collected in the cooling chamber 14a. By the heating, the liquid-phase refrigerant is boiled as shown in FIG. 5 and the bubbles 14e of the gas-phase refrigerant are generated in the liquid-phase refrigerant. A heating temperature of the bubble generator 22 is set experimentally in advance, for example, to a temperature sufficient to boil the liquid-phase refrigerant and as low a temperature as possible.

When the bubbles 14e are generated in the liquid-phase refrigerant in the cooling chamber 14a in a case where the thermosiphon phenomenon is at the standstill, such generation of the bubbles triggers to circulate the refrigerant in the fluid circulation circuit 26 as shown by arrows ARc, and thereby the thermosiphon phenomenon is started.

In step S104, the controller 24 stops generating the bubbles 14e by the bubble generator 22. In other words, the controller 24 turns off the bubble generator 22 to stop heating the liquid-phase refrigerant by the bubble generator 22. In a case where the bubble generators 22 is already turned off, the controller 24 hold the bubble generator 22 turned off. After step S103 or step S104, the procedure returns to step S101.

In this way, the bubble generator 22 is switched on/off according to a determination result in steps S101 and S102. For example, when the bubble generator 22 is switched on from off in step S103, the generation of the bubbles 14e triggers to start the thermosiphon phenomenon. Then, when the thermosiphon phenomenon is started, a determination result in step S102 is switched and the bubble generator 22 is switched off from on in step S104. In other words, after the controller 24 causes the bubble generator 22 to start generating the bubbles 14e, in a case where the circulation flow rate of the refrigerant becomes more than the specified flow rate Q1, the controller 24 causes the bubble generator 22 to stop generating the bubbles 14e.

Further, when the thermosiphon phenomenon is started by the generation of the bubbles 14e, the bubble generator 22 is switched off from on, so the bubble generator 22 is temporarily turned on in the control processing shown in FIG. 4. Thus, it can be said that in a case where the precondition described above for switching on the bubble generator 22 is satisfied and the circulation flow rate of the refrigerant is the specified flow rate Q1 or less, the controller 24 of the present embodiment causes the bubble generator 22 to temporarily generate the bubbles 14e.

The abovementioned processing in each of the steps shown in FIG. 4 configures a function part for realizing each of functions. This is the same for the flow chart shown in FIG. 6, which will be described later.

The device temperature regulator 10 employs the thermosiphon system, so in a state where the battery 12 does not become a high temperature and where a difference between the temperature of the battery 12 and the outside air temperature (that is, the temperature of the heat receiving fluid in the condenser 16) is small, the refrigerant is not circulated as shown in FIG. 1. In this case, the liquid-phase refrigerant is collected in the battery cooler 14 arranged in a lower portion in the fluid circulation circuit 26. Here, if variations are caused in the temperatures of the plurality of battery cells 121 included by the battery 12, the liquid-phase refrigerant in contact with a portion connected to the battery cells 121 each having a high temperature of the upper surface part 141 of the battery cooler 14 is boiled and gasified, thereby being partially cooled. In this way, the temperatures of the plurality of battery cells 121 are equalized.

On the other hand, if the device temperature regulator 10 is inclined integrally with the vehicle in a scene where the battery 12 does not generate heat, for example, while the vehicle is parking and left unattended and where a difference between the temperature of the battery 12 and the outside air temperature is small, the liquid surface 14d of the refrigerant is leaned in the battery cooler 14. Then, there is caused a portion in which the liquid-phase refrigerant is not in contact with the upper surface part 141 of the battery cooler 14. In other words, a portion in which heat is not easily exchanged with the liquid-phase refrigerant is caused in the plurality of battery cells 121. If the battery cooler 14 is left unattended with the refrigerant not circulated in this state, the battery cooler 14 cannot sufficiently cool the battery cell 121 connected to the portion which is not in contact with the liquid-phase refrigerant of the upper surface part 141 of the battery cooler 14, so that the temperatures of the plurality of battery cells 121 cannot be sufficiently equalized.

Hence, according to the present embodiment, as shown in FIG. 5, the device temperature regulator 10 is provided with the bubble generator 22 that generates bubbles 14e in the liquid-phase refrigerant collected in the battery cooler 14. As shown in FIG. 4, in a case where the predetermined precondition is satisfied and where the circulation flow rate of the refrigerant circulating in the fluid circulation circuit 26 is the specified flow rate Q1 or less, the controller 24 of the device temperature regulator 10 causes the bubble generator 22 to generate the bubbles 14e. Thus, it is possible to start cooling the battery 12 as appropriate by the fluid circulation circuit 26 configured as the loop-type thermosiphon.

To be more specific, a case where the above-mentioned precondition is satisfied is a case where the battery cooler 14 is inclined by the specified angle AG1 or more with respect to the predetermined reference posture. The bubble generator 22 is the heating source. Thus, in a case where the battery cooler 14 is inclined by the specified angle AG1 or more with respect to the predetermined reference posture and where the circulation flow rate of the refrigerant circulating in the fluid circulation circuit 26 is the specified flow rate Q1 or less, the bubble generator 22 temporarily heats and boils the liquid-phase refrigerant collected in the battery cooler 14. In this way, the bubbles 14e of the gas-phase refrigerant can push up the liquid surface 14d of the refrigerant in the battery cooler 14 to thereby bring the liquid-phase refrigerant into contact with the whole of the upper surface part 141 of the battery cooler 14 even in a state where the battery cooler 14 is inclined. As a result, the temperatures of the plurality of battery cells 121 can be sufficiently equalized. Then, even in a state where the vehicle is inclined with respect to the vehicle horizontal state, the respective battery cells 121 can be equalized in the temperature and can be cooled. Thus, it is possible to suppress the battery cell temperature from being varied and to the battery 12 from being impaired.

Further, according to the present embodiment, as shown in FIG. 4, in a case where the abovementioned precondition is satisfied and where the circulation flow rate of the refrigerant is the specified flow rate Q1 or less, the controller 24 causes the bubble generator 22 to temporarily generate the bubbles 14e. Thus, it is possible to accelerate the bubbling of the refrigerant in the battery cooler 14 and to cause the liquid-phase refrigerant to flow to the whole of the upper surface part 141 of the battery cooler 14.

Then, the generation of the bubbles 14e by the bubble generator 22 can be used as a trigger to start circulating the refrigerant in the fluid circulation circuit 26. In short, the bubble generator 22 can be used as an activation device for starting the thermosiphon phenomenon. Then, it is possible to avoid the generation of the bubbles 14e by the bubble generator 22 from being continued unnecessarily after the thermosiphon phenomenon is started. In this way, even in a case where a temperature difference between the battery temperature and the outside air temperature is not made large enough to start the thermosiphon phenomenon, the thermosiphon phenomenon can be started by causing the bubble generator 22 to function as the abovementioned activation device.

Further, according to the present embodiment, as shown in FIG. 4, in a case where the circulation flow rate of the refrigerant becomes more than the specified flow rate Q1 after the controller 24 causes the bubble generator 22 to start generating the bubbles 14e, the controller 24 causes the bubble generator 22 to stop generating the bubbles 14e. In the other words, in this way, the controller 24 causes the controller 22 to temporarily generate the bubbles 14e. Thus, it is possible to avoid the generation of the bubbles 14e by the bubble generator 22 from being continued unnecessarily after the thermosiphon phenomenon is started.

Further, according to the present embodiment, as shown in FIG. 1 and FIG. 3, the bubble generator 22 is arranged at a position closer to the inflow port 14b than the outflow port 14c of the battery cooler 14. Here, even when the circulation flow rate of the refrigerant is the specified flow rate Q1 or less, the condensed refrigerant liquid slightly returns to the battery cooler 14 from the condenser 16 near the inflow port 14b and, in this case, the returned condensed refrigerant liquid is evaporated to cool the battery 12.

Thus, in the case of assuming that the gas-phase refrigerant exists unevenly on the outflow port 14c side or on the inflow port 14b side in the battery cooler 14, because, for example, the vehicle is inclined, an advantage to start the thermosiphon phenomenon becomes larger in a case where the gas-phase refrigerant exists unevenly on the outflow port 14c than in a case where the gas-phase refrigerant exists unevenly on the inflow port 14b side. Then, a case where the gas-phase refrigerant exists unevenly on the outflow port 14c side is, in other words, a case where the liquid-phase refrigerant exists unevenly on the inflow port 14b side. From this, the bubble generator 22 can be arranged at a position in which a bubble generating operation is easily applied to the liquid-phase refrigerant under a situation where an advantage to start the thermosiphon phenomenon is large, in other words, at a position closer to the inflow port 14b. In short, the bubble generator 22 can be arranged at a position in which the liquid-phase refrigerant is surely collected under a situation where an advantage to start the thermosiphon phenomenon is large.

Further, according to the present embodiment, as shown in FIG. 5, the bubble generator 22 heats the liquid-phase refrigerant to thereby generate the bubbles 14e. Thus, a heating source of the electric heater or the like can be used as the bubble generator 22, in other words, the heating source can be used for boiling the liquid-phase refrigerant to thereby cool the battery 12.

In the battery temperature regulator of Patent Document 1, a heating member for heating a heating medium is disposed in a temperature regulating part, but the heating member is nothing but a battery heater for heating a battery. In contrast to this, the bubble generator 22 of the heating source of the present embodiment does not aim at warming the battery but and is used as a device to accelerate the cooling of the battery 12. In this point, the bubble generator 22 of the present embodiment is different from the heating member described in Patent Document 1.

Further, according to the present embodiment, the plurality of battery cells 121 are arranged respectively side by side on the upper surface part 141a of the battery cooler 14. In other words, the respective battery cells 121 of the battery 12 are placed on the upper surface part 141 of the battery cooler 14. Here, for example, in the battery temperature regulator of Patent Document 1, the temperature regulating parts are arranged on the side surfaces of the respective battery cells and, in order to accelerate a heat transfer between the temperature regulating part and the contact surface of the battery cell, some degree of pressing load (for example, binding force) is necessary between them.

In contrast to this, in the device temperature regulator 10 of the present embodiment, the respective battery cells 121 are placed on the battery cooler 14 as described above, in other words, the battery cooler 14 is arranged not on the side surfaces but on the lower surfaces of the battery cells 121. For this reason, a contact load can be secured between the battery cell 121 and the battery cooler 14 by the own weight of the battery cell 121. Thus, a lower surface cooling method according to the present embodiment in which the battery cooler 14 is arranged on the lower side of the battery 12 is more advantageous in terms of cooling the battery 12 than a method of arranging the temperature regulating part which is described in Patent Document 1.

Further, according to the present embodiment, for example, as shown in FIG. 3, when the refrigerant is in the liquid phase in the portion on the upstream side with the liquid surface 14d of the battery cooler 14 as a border and is in the gas phase on the portion on the downstream side, it is determined in the step S101 shown in FIG. 4 that the battery cooler 14 is inclined by the specified angle AG1 or more with respect to the reference posture. In other words, when the refrigerant in the portion on the upstream side of the battery cooler 14 is in the liquid phase and the refrigerant in the portion on the downstream side of the batter cooler 14 is in the gas phase, the controller 24 causes the bubble generator 22 to generate the bubbles 14e. In this way, as described above, it is possible to activate the cooling of the battery 12 as appropriate by the fluid circulation circuit 26.

Second Embodiment

Next, a second embodiment will be described. In the present embodiment, points different from the first embodiment described above will be mainly described. Further, descriptions of the same or equivalent parts as in the first embodiment will be omitted or simplified. The same is true for a third embodiment to be described later and for the embodiments following the third embodiment.

Figure 6:
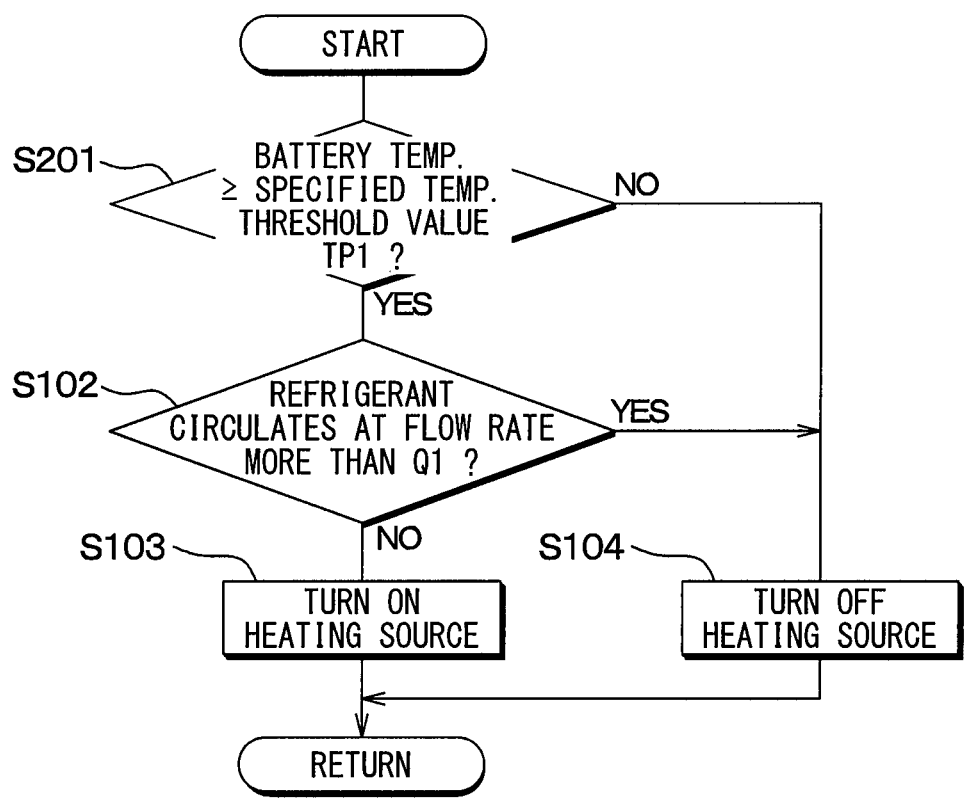
FIG. 6 is a flow chart to show control processing of a controller included by a device temperature regulator of a second embodiment and is a diagram corresponding to FIG. 4 of the first embodiment.

As shown in FIG. 6, the present embodiment is different from the first embodiment in the control processing performed by the controller 24. In the other processing, the present embodiment is the same as the first embodiment.

Specifically, step S201 shown in FIG. 6 is different from the control processing of the first embodiment. In other words, in the control processing of the present embodiment, the step S101 shown in FIG. 4 is replaced by step S201 shown in FIG. 6. Steps S102, S103, and S104 other than the step 201 shown in FIG. 6 are the same as the control processing of the first embodiment. Further, the control processing shown in FIG. 6 is performed repeatedly cyclically just like the control processing shown in FIG. 4.

As shown in FIG. 6, the controller 24 determines in the step S201 whether or not the temperature of the battery 12 (that is, the battery temperature) becomes a specified temperature threshold value TP1 or more. It is a predetermined precondition for turning on the bubble generator 22 that the battery temperature becomes the specified temperature threshold value TP1 or more. In other words, a case where the precondition is satisfied is a case where the battery temperature becomes the specified temperature threshold value TP1 or more.

The temperature threshold value TP1 is determined experimentally in advance so as to be able to determine that when the battery temperature becomes the specified temperature threshold value TP1 or more, the battery 12 needs to be cooled. The battery temperature which is compared with the temperature threshold value TP1 in the step S201 is, for example, a maximum value of the temperatures of the respective battery cells 121. Further, the temperature of each battery cell 12 is detected by the battery cell temperature sensor 28b (see FIG. 2) provided on each of the plurality of battery cells 121.

In a case where it is determined in the step S201 shown in FIG. 6 that the battery temperature becomes the specified temperature threshold value TP1 or more, the procedure proceeds to step S102. On the other hand, in a case where it is determined that the battery temperature is less than the specified temperature threshold value TP1, the procedure proceeds to step S104.

In the present embodiment, the effects produced by the configuration common to the first embodiment can be acquired as is the case with the first embodiment.

Further, according to the present embodiment, in a case where the predetermined precondition is satisfied and where the circulation flow rate of the refrigerant circulating in the fluid circulation circuit 26 is the specified flow rate Q1 or less, the controller 24 of the device temperature regulator 10 causes the bubble generator 22 to generate the bubbles 14e. The case where the predetermined precondition is satisfied is a case where the battery temperature becomes the specified temperature threshold value TP1 or more.

If nothing is done even in a state where a temperature difference between the battery temperature and the temperature of the outside air of the heat receiving fluid of the condenser 16 is smaller than a certain limit value, the thermosiphon phenomenon in which the refrigerant is circulated is not caused but the liquid-phase refrigerant remains collected in the battery cooler 14. The battery 12 is frequently arranged, for example, under the floor of the vehicle compartment or under the trunk room, so in a scene where the vehicle is left unattended under blazing sun for a long time, for example, when the vehicle is parking in the summer, the battery temperature is gradually increased and hence the battery 12 needs to be cooled.

However, the thermosiphon phenomenon does not start naturally when there is not a certain degree of temperature difference between the battery temperature and the outside air temperature. For this reason, in a case where a rise in the battery temperature is moderate, it can be thought that even if the battery temperature is higher than the outside air temperature, the thermosiphon phenomenon does not start naturally in some cases.

Figure 7:
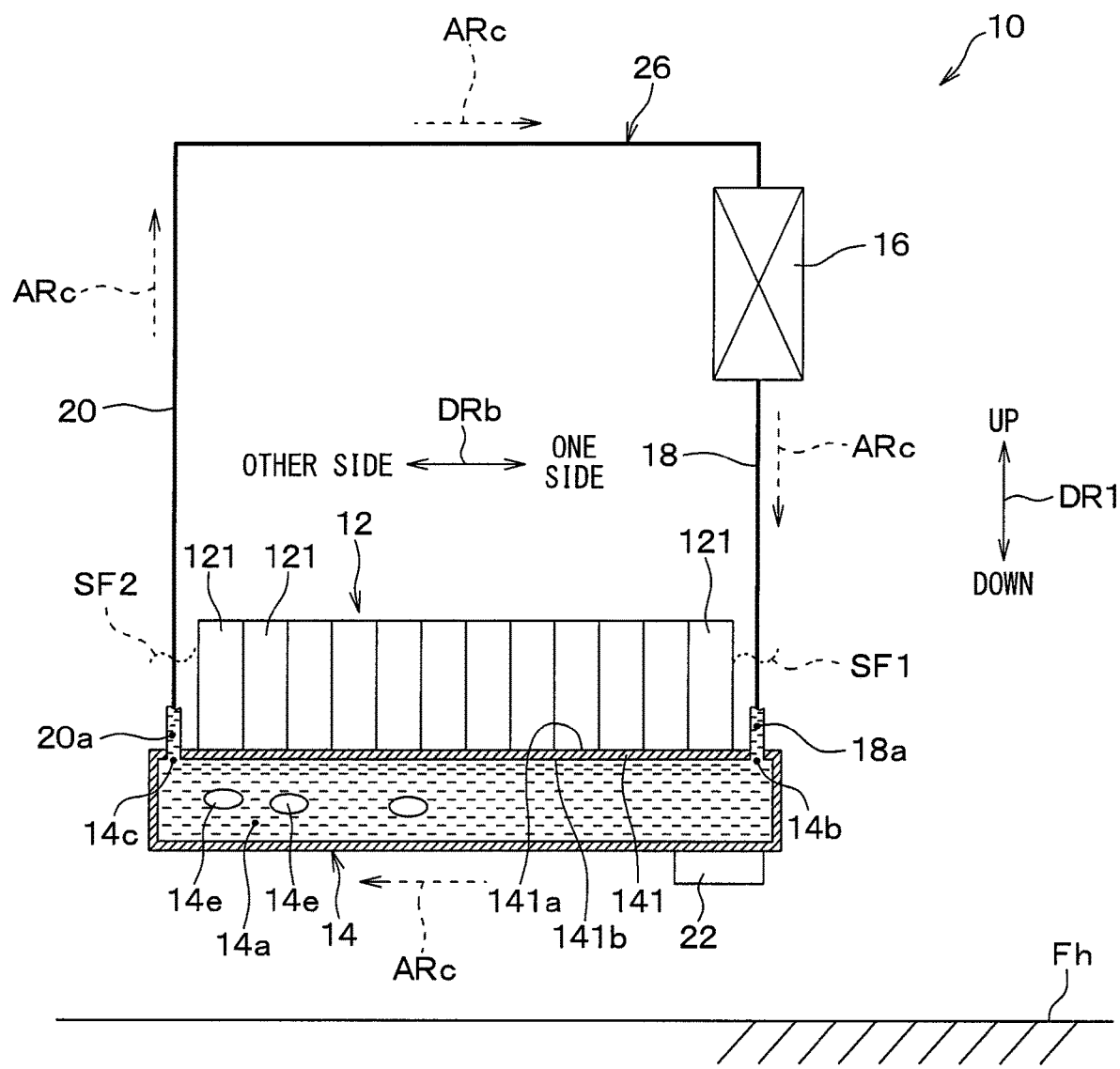
FIG. 7 is a schematic diagram to show a state where a bubble generator included by the device temperature regulator of the second embodiment generates bubbles and is a diagram corresponding to FIG. 5 of the first embodiment.

In contrast to this, as described above, in a case where the battery temperature becomes the specified temperature threshold value TP1 or more and where the circulation flow rate of the refrigerant circulating in the fluid circulation circuit 26 is the specified flow rate Q1 or less, the controller 24 of the present embodiment causes the bubble generator 22 to generate the bubbles 14e as shown in FIG. 7. In this way, the generation of the bubbles 14e can trigger to accelerate the boiling of the refrigerant in the battery cooler 14 to thereby start the thermosiphon phenomenon, which hence can circulate the refrigerant.

Then, when the circulation of the refrigerant (that is, the thermosiphon phenomenon) once starts in the fluid circulation circuit 26, the circulation of the refrigerant continues as far as a temperature difference between the battery temperature and the outside air temperature exists. For this reason, also in the control processing of the present embodiment, at a timing when it is determined in the step S102 shown in FIG. 6 that the circulation flow rate of the refrigerant becomes more than the specified flow rate Q1, that is, at a timing when it is determined that the refrigerant is circulated, the generation of the bubbles 14e by the bubble generator 22 is stopped. Thus, also in the present embodiment, as is the case with the first embodiment, it is possible to avoid the generation of the bubbles 14e by the bubble generator 22 from being continued unnecessarily after the thermosiphon phenomenon is started.

In the present embodiment, as can be seen that step S101 shown in FIG. 4 is replaced by step S201 shown in FIG. 6, regardless of the inclination of the vehicle, according to the determinations in steps S201 and S102 shown in FIG. 6, the heating source as the bubble generator 22 is turned on.

Third Embodiment

Next, a third embodiment will be described. In the present embodiment, points different from the first embodiment described above will be mainly described.

Figure 8:
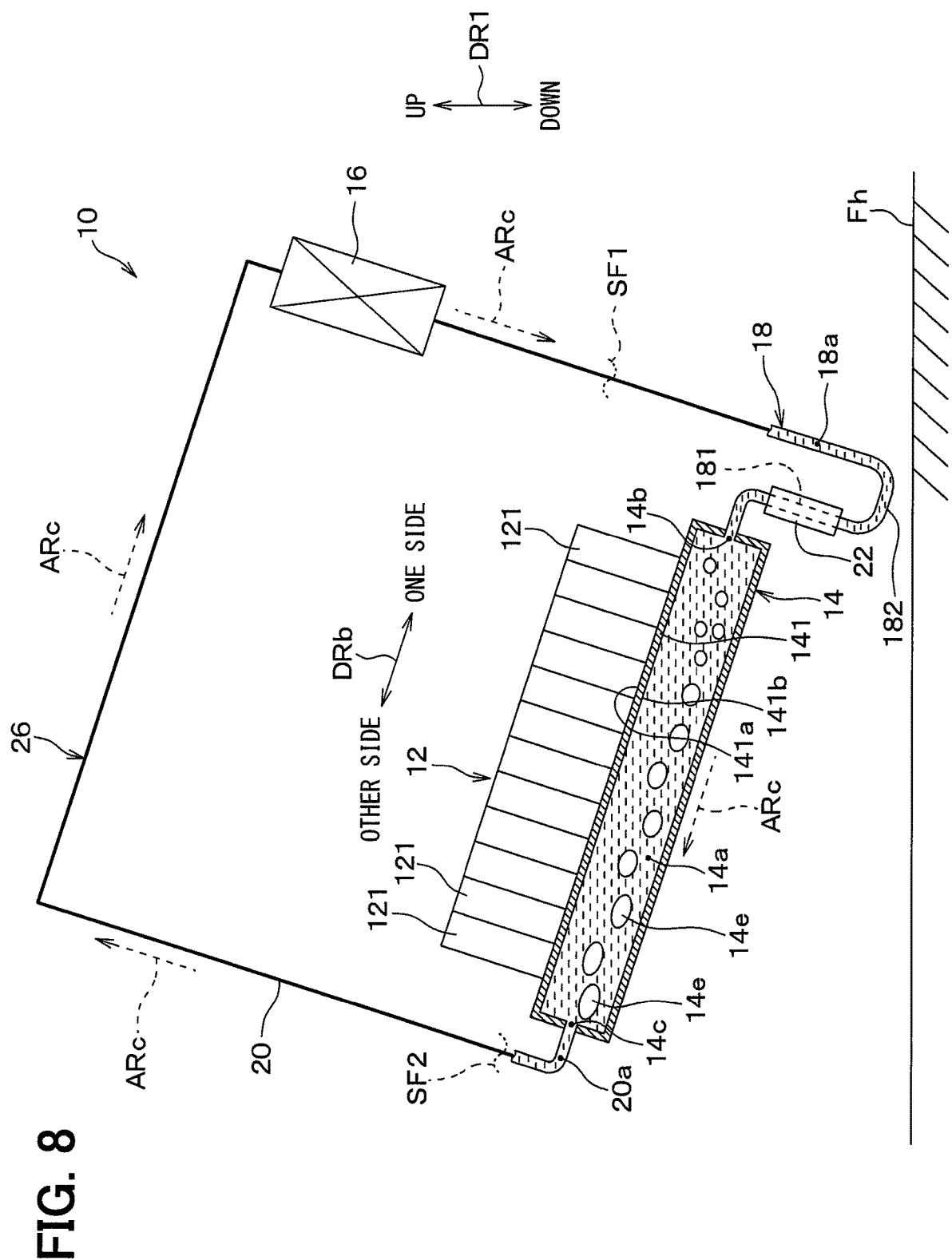
FIG. 8 is a schematic diagram, which shows a general configuration of a device temperature regulator of a third embodiment and shows a situation in which the bubble generator generates bubbles in a state where the vehicle is inclined with respect to the vehicle horizontal state, and is a diagram corresponding to FIG. 5 of the first embodiment.

As shown in FIG. 8, the present embodiment is different from the first embodiment in the arrangement of the bubble generator 22 and in the shape of the forward pipe 18. The present embodiment is the same as the first embodiment in the other portions.

Specifically, as shown in FIG. 8, the forward pipe 18 is partially formed in a shape of a letter U and has a bubble-generator arrangement part 181 and a lower arrangement part 182. The bubble-generator arrangement part 181 and the lower arrangement part 182 are included by a portion formed in the shape of the letter U. Then, the lower arrangement part 182 is arranged closer to the condenser 16 side than the bubble-generator arrangement part 181 in a refrigerant flow of the forward flow passage 18a.

Further, the bubble-generator arrangement part 181 is provided with the bubble generator 22. In other words, the bubble generator 22 is disposed between the inflow port 14b of the battery cooler 14 and the lower arrangement part 182 of the forward pipe 18 in a pipe portion in which the liquid-phase refrigerant collects of the forward pipe 18.

In the present embodiment, the bubble generator 22 is coupled to the bubble-generator arrangement part 181 so as to surround the outside of the bubble-generator arrangement part 181. In this way, the bubble generator 22 can heat the refrigerant in the bubble-generator arrangement part 181 from the outside of the bubble-generator arrangement part 181.

Further, the lower arrangement part 182 is arranged below the bubble-generator arrangement part 181. For example, when the vehicle is in the vehicle horizontal state, the lower arrangement part 182 is arranged below the bubble-generator arrangement part 181. Further, even if the battery cooler 14 is inclined in any direction within a specified range which could be caused from a using state of the vehicle, the lower arrangement part 182 is arranged below the bubble-generator arrangement part 181.

In the present embodiment, the effects produced by the configuration common to the first embodiment can be acquired as is the case with the first embodiment.

Further, according to the present embodiment, the bubble-generator arrangement part 181 of the forward pipe 18 is provided with the bubble generator 22, and the lower arrangement part 182 is arranged below the bubble-generator arrangement part 181. The lower arrangement part 182 is arranged closer to the condenser 16 side than the bubble-generator arrangement part 181 in the refrigerant flow of the forward flow passage 18a. Hence, the bubble generator 22 can be arranged at a portion other than the battery cooler 14 and the bubbles 14e can be generated in the liquid-phase refrigerant collected in the battery cooler 14. In short, the degree of freedom of a position in which the bubble generator 22 is mounted can be expanded. From an up-and-down position relation between the bubble-generator arrangement part 181 and the lower arrangement part 182, the bubbles generated in the bubble-generator arrangement part 181 by the bubble generator 22 can be prevented from flowing to the condenser 16 side in the forward flow passage 18a. In other words, it is possible to prevent the bubbles from flowing backward in the forward flow passage 18a.

The present embodiment is a modification based on the first embodiment, and the present invention can also be combined with the second embodiment described above.

Fourth Embodiment

Next, a fourth embodiment will be described. In the present embodiment, points different from the first embodiment described above will be mainly described.

Figure 9:
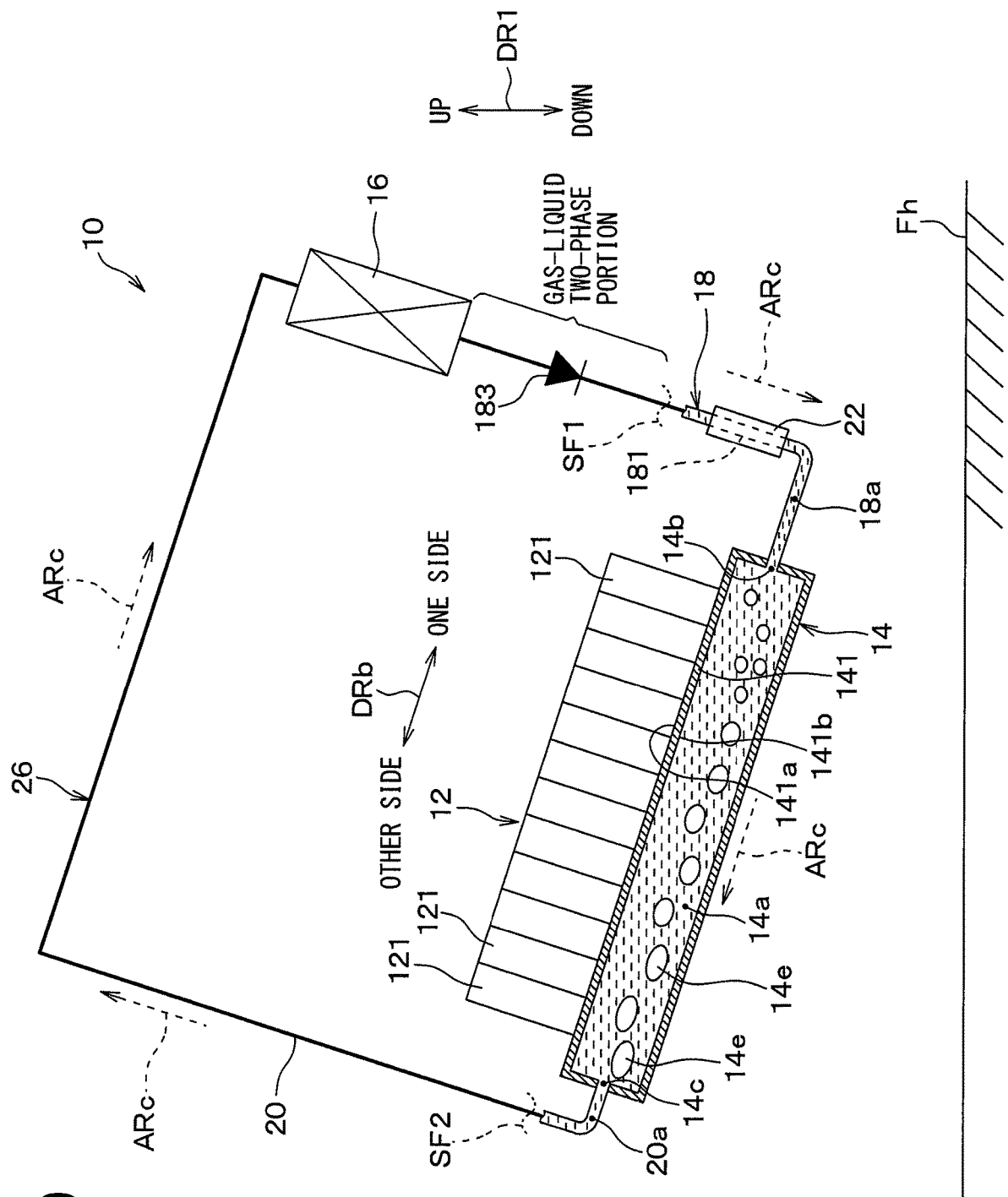
FIG. 9 is a schematic diagram, which shows a general configuration of a device temperature regulator of a fourth embodiment and shows a situation in which the bubble generator generates bubbles in a state where the vehicle is inclined with respect to the vehicle horizontal state, and is a diagram corresponding to FIG. 5 of the first embodiment.

As shown in FIG. 9, the present embodiment is different from the first embodiment in the arrangement of the bubble generator 22 and the forward pipe 18. The present embodiment is the same as the first embodiment in the other portions.

Specifically, as shown in FIG. 9, the forward pipe 18 includes the bubble-generator arrangement part 181 and a check valve 183. Then, the check valve 183 allows a refrigerant flow to the battery cooler 14 from the condenser 16 in the forward flow passage 18a, whereas the check valve 183 suppresses the refrigerant flow to the condenser 16 from the battery cooler 14. In short, the check valve 183 inhibits the refrigerant flow from flowing backward in the forward flow passage 18a.

Further, the check valve 183 is arranged closer to the condenser 16 side than the bubble-generator arrangement part 181 in the refrigerant flow in the forward flow passage 18a. In more details, the check valve 183 is arranged above a position of the liquid surface SF1 formed in the forward pipe 18 and hence is arranged at a portion in which the refrigerant is in a gas-liquid two-phase in the forward pipe 18.

Further, the bubble-generator arrangement part 181 is provided with the bubble generator 22. In other words, the bubble generator 22 is provided between the inflow port 14b of the battery cooler 14 and the check valve 183 in a pipe portion in which the liquid-phase refrigerant collects in the forward pipe 18.

Also in the present embodiment, as is the case with the third embodiment, the bubble generator 22 is coupled to the bubble-generator arrangement part 181 so as to surround the outside of the bubble-generator arrangement part 181.

In the present embodiment, the effects produced by the configuration common to the first embodiment can be acquired as is the case with the first embodiment.

Further, according to the present embodiment, the bubble-generator arrangement part 181 of the forward pipe 18 is provided with the bubble generator 22, and the check valve 183 allows a refrigerant flow to the battery cooler 14 from the condenser 16 in the forward flow passage 18a, whereas the check valve 183 inhibits the refrigerant flow from flowing backward. Then, the check valve 183 is arranged closer to the condenser 16 side than the bubble-generator arrangement part 181 in the refrigerant flow in the forward flow passage 18a. Thus, the bubble generator 22 can be arranged at a portion other than the battery cooler 14 and the bubbles 14e can be generated in the liquid-phase refrigerant collected in the battery cooler 14. Still further, the degree of freedom of a position in which the bubble generator 22 is mounted can be expanded more than the third embodiment. Then, the bubbles generated in the bubble-generator arrangement part 181 by the bubble generator 22 can be prevented from flowing to the condenser 16 side in the forward flow passage 18a by the check valve 183.

The present embodiment is a modification based on the first embodiment and the present invention can also be combined with the second embodiment described above.

Fifth Embodiment

Next, a fifth embodiment will be described. In the present embodiment, points different from the first embodiment described above will be mainly described.

The bubble generator 22 of the present embodiment is not a heating source but an ultrasonic vibrator. The present embodiment is different from the first embodiment described above in this point. The present embodiment is the same as the first embodiment in the other portions.

In the present embodiment, as shown in FIG. 1, the bubble generator 22 of the ultrasonic vibrator is joined to a lower wall of the battery cooler 14 as is the case with the first embodiment, so that an ultrasonic vibration caused by the bubble generator 22 is transferred to the refrigerant in the cooling chamber 14a via the lower wall.

The bubble generator 22 applies the ultrasonic vibration to the liquid-phase refrigerant, thereby causing the liquid-phase refrigerant to generate bubbles 14e shaped like microbubbles as shown in FIG. 5. In this way, the bubble generator 22 of the present embodiment can acquire the same effects as the bubble generator 22 of the first embodiment without heating the refrigerant in the battery cooler 14. The same effects as the bubble generator 22 of the first embodiment are, for example, an effect of pushing up the liquid surface 14d of the refrigerant in the battery cooler 14 and an effect of accelerating the boiling of the refrigerant in the battery cooler 14.

The present embodiment is a modification based on the first embodiment and can also be combined with any of the second to the fourth embodiments described above.

Other Embodiments (1) In the respective embodiments described above, as shown in FIG. 1, the target device cooled by the device temperature regulator 10 is the secondary battery 12 but there is no limitation to the target device. For example, the target device may be an electronic device other than the secondary battery 12 such as a motor, an inverter, or a charger, or may be a simple heating body. Further, the target device is not limited to a device mounted on the vehicle but may be a device which is stationary and is necessary to be cooled, for example, a base station.

(2) In the second embodiment described above, the battery temperature which is compared with the temperature threshold value TP1 in step S210 shown in FIG. 6 is assumed to be, for example, the maximum value of the temperatures of the respective battery cells 121, but this is one example. The temperature threshold value TP1 only needs to be determined as appropriate according to a method of determining the battery temperature, and for example, the battery temperature may be calculated as an average value of the temperatures of the respective battery cells 121.

(3) In the third and the fourth embodiments described above, the bubble generator 22 is provided so as to surround the outside of the bubble-generator arrangement part 181, but this is one example. For example, the bubble generator 22 may be arranged in the bubble-generator arrangement part 181 to configure a part of the forward pipe 18.

(4) In the respective embodiments described above, the forward pipe 18 is provided as a forward passage of the device temperature regulator 10 but the forward passage does not need to be formed of a piping member. For example, in a case where a hole formed in a block-shaped part is provided as the forward flow passage 18a, a portion to form the forward flow passage 18a of the block-shaped part corresponds to the forward passage. The same is true for the backward pipe 20.

(5) In the respective embodiments described above, as shown in FIG. 1, the device temperature regulator 10 is provided with one condenser 16 but the device temperature regulator 10 may be provided with a plurality of condensers 16. In a case where the device temperature regulator 10 is provided with the plurality of condensers 16 in this way, the plurality of condensers 16 may include any one or all of a heat exchanger which exchanges heat between the air and the refrigerant in the fluid circulation circuit 26 just like the respective embodiments described above, a refrigerant-refrigerant heat exchanger, and a chiller. The refrigerant-refrigerant heat exchanger is a heat exchanger which configures a part of the refrigeration cycle and which evaporates a heat exchange medium circulating in the refrigeration cycle to thereby cool the refrigerant of the fluid circulation circuit 26. Further, the chiller is a cooling device which cools the refrigerant in the fluid circulation circuit 26 by a liquid medium such as a cooling water.

(6) In the respective embodiments described above, the refrigerant filled in the fluid circulation circuit 26 is, for example, a chlorofluorocarbon-based refrigerant but the refrigerant in the fluid circulation circuit 26 is not limited to the chlorofluorocarbon-based refrigerant. For example, other refrigerant such as propane or $CO_2$ or other medium to change its phase is allowed to be used as the refrigerant filled in the fluid circulation circuit 26.

(7) In the respective embodiments described above, the determination in step S102 shown in FIG. 4 is made on the basis of the circulation flow rate of the refrigerant detected by the flow rate sensor 28a but may be made on the basis of the detected value of the other sensor without using the flow rate sensor 28a. For example, a case is assumed where the determination in step S102 shown in FIG. 4 is made on the basis of a detected value of the temperature sensor 28f on the one side and a detected value of the temperature sensor 28g on the other side, the temperature sensors 28f, 28g being shown in FIG. 10.

Figure 10:
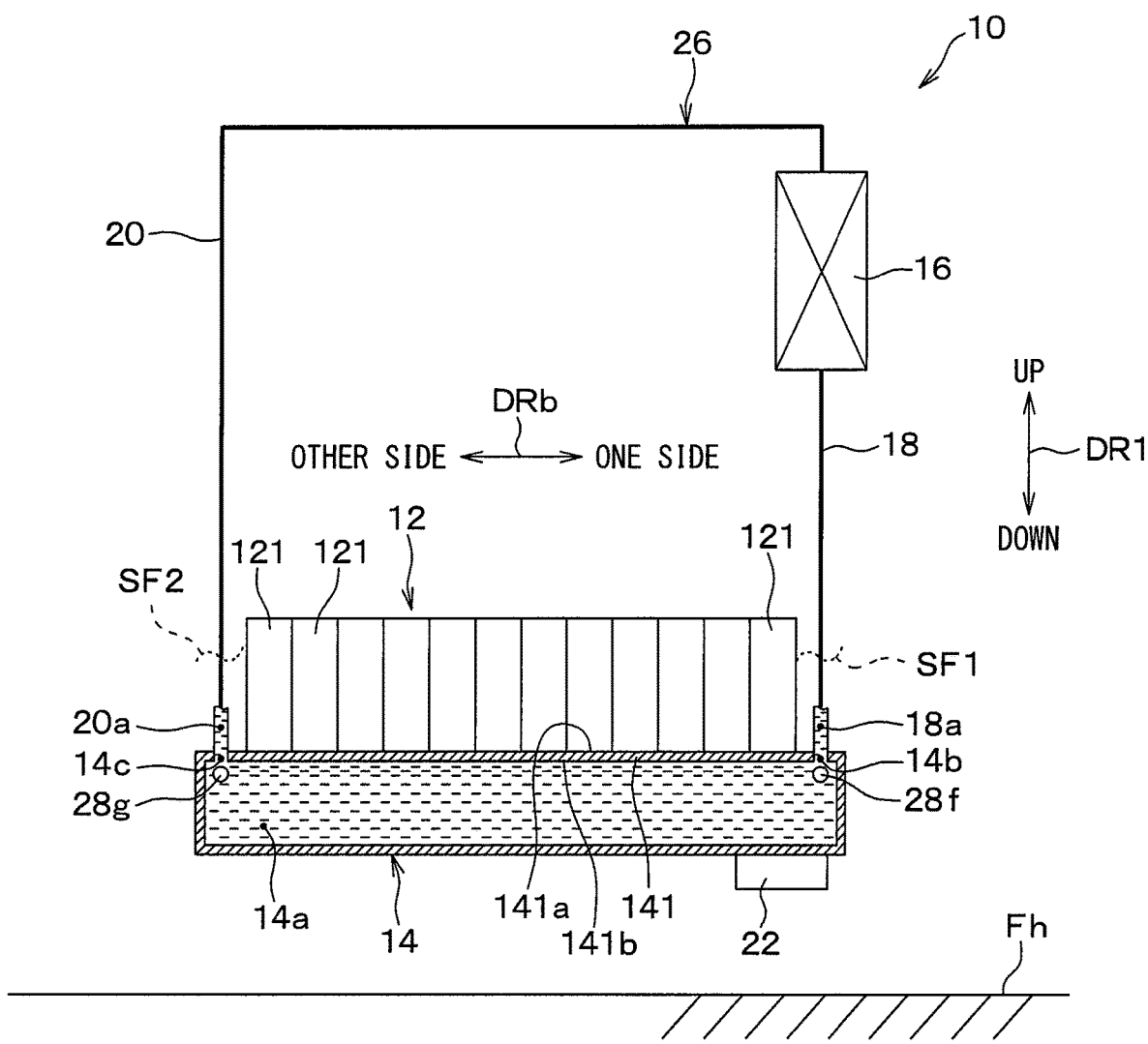
FIG. 10 is a schematic diagram, which shows a general configuration of a device temperature regulator in a modification of the first embodiment and shows an arrangement of a one-side temperature sensor and an other-side temperature sensor which are provided in the battery cooler, and is a diagram corresponding to FIG. 1 of the first embodiment.

In FIG. 10, the temperature sensor 28f on the one side and the temperature sensor 28g on the other side are arranged in the upper portions of the cooling chamber 14a. Then, the temperature sensor 28f on the one side is provided at an end portion on the one side in the battery stacking direction DRb of the cooling chamber 14a, and the temperature sensor 28g on the other side is provided at an end portion on the other side in the battery stacking direction DRb of the cooling chamber 14a. For this reason, in a case where the battery cooler 14 is inclined by the specified angle AG1 or more with respect to the reference posture with either of the one side and the other side as an upper side in the battery stacking direction DRb when the bubbles 14e are not generated, one of the temperature sensors 28*f*, 28*g* is exposed above the liquid surface 14*d*. Here, in a case where when the battery cooler 14 is inclined by the specified angle AG1 or more with respect to the reference posture with either of the one side and the other side as the upper side in the battery stacking direction DRb, if the thermosiphon phenomenon is not caused, variations in the temperature in the battery cooler 14 becomes large. Conversely, if the thermosiphon phenomenon is caused, variations in the temperature in the battery cooler 14 are reduced, that is, the temperatures in the battery cooler 14 are equalized.

Hence, in step S102 shown in FIG. 4, in a case where a difference between the detected temperatures of both of the temperature sensors 28*f* and 28*g* is less than a specified temperature difference determination value, it can be determined that the thermosiphon phenomenon is caused. In other words, it can be determined that the circulation flow rate of the refrigerant circulating in the fluid circulation circuit 26 is more than the specified flow rate Q1.

Conversely, in a case where the difference between the detected temperatures of both of the temperature sensors 28*f* and 28*g* is the specified temperature difference determination value or more, it can be determined that the thermosiphon phenomenon is not caused. In other words, it can be determined that the circulation flow rate of the refrigerant is the specified flow rate Q1 or less. The detected temperature of the temperature sensor 28*f* on the one side shown in FIG. 10 may be replaced by the detected temperature detected by the battery cell temperature sensor 28*b* of the battery cell 121 arranged closest to the one side in the battery stacking direction DRb of the battery 12. The detected temperature of the temperature sensor 28*g* on the other side shown in FIG. 10 may be replaced by the detected temperature detected by the battery cell temperature sensor 28*b* of the battery cell 121 arranged closest to the other side in the battery stacking direction DRb of the battery 12.

(8) In the second embodiment described above, a determination in step S102 shown in FIG. 6 is made on the basis of the circulation flow rate of the refrigerant detected by the flow rate sensor 28*a* but may be made on the basis of the detected value of the other sensor without using the flow rate sensor 28*a*. For example, a case is assumed where the determination in step S102 shown in FIG. 6 is made on the basis of the detected value of an outflow port refrigerant temperature sensor for detecting a refrigerant temperature at the outflow port 14*c* of the battery cooler 14.

For example, in a case where the battery temperature becomes the specified temperature threshold value TP1 or more and the battery 12 becomes a high temperature, when the thermosiphon phenomenon is started from a state where the thermosiphon phenomenon is not caused, the cooling of the battery 12 is accelerated and hence the refrigerant temperature at the outflow port 14*c* is decreased. Thus, in the configuration using the outflow port refrigerant temperature sensor described above, in a case where a decrease width of the detected temperature of the outflow port refrigerant temperature sensor with respect to the detected temperature of the outflow port refrigerant temperature sensor detected before the bubble generator 22 is turned on becomes a specified temperature decrease width determination value or more, it can be determined that the thermosiphon phenomenon is started. The detected temperature of the outflow port refrigerant temperature sensor may be replaced by a detected temperature detected by the battery cell temperature sensor 28*b* of the battery cell 121 closest to the outflow port 14*c* of the battery cooler 14 of the battery 12.

(9) In the first embodiment described above, in the determination in step S101 shown in FIG. 4, the direction of an inclination of the battery cooler 14 does not have plus and minus, but this is an example. In the determination in step S101, it can also be thought that the inclination of the battery cooler 14 which is the specified angle AG1 or more with respect to the reference posture is limited to an inclination in which the other side in the battery stacking direction DRb of the battery cooler 14 is located above the one side, as shown in FIG. 5.

(10) In the first embodiment described above, as shown in FIG. 4, in a case where the circulation flow rate of the refrigerant becomes more than the specified flow rate Q1 after the bubble generator 22 starts generating the bubbles 14*e*, the generation of the bubbles 14*e* by the bubble generator 22 is stopped, but this is an example. For example, in a case where the bubble generator 22 starts generating the bubbles 14*e*, it can also be thought that the generation of the bubbles 14*e* by the bubble generator 22 is stopped by a timer after a specified time passes from the time when the bubble generator 22 starts generating the bubbles 14*e*.

In other words, in a case where the controller 24 causes the bubble generator 22 to start generating the bubbles 14*e* and the specified time passes after the generation of the bubbles 14*e* is started, the controller 24 may stop generating the bubbles 14*e* by the bubble generator 22 to thereby cause the bubble generator 22 to temporarily generate the bubbles 14*e*. Even in this way, as is the case with the first embodiment, it is possible to avoid the generation of the bubbles 14*e* by the bubble generator 22 from being continued unnecessarily after the thermosiphon phenomenon is started. The same is true for the second embodiment.

(11) In the respective embodiments described above, the device temperature regulator 10 cools the battery 12 to regulate the temperature of the battery 12, and the device temperature regulator 10 is allowed to have not only such a cooling function but also a heating function of heating the battery 12.

(12) In the respective embodiments described above, as shown in FIG. 1, the bubble generator 22 is provided on the lower wall of the battery cooler 14 but is allowed to be provided on the other portion such as a side wall of the battery cooler 14.

Figure 11:
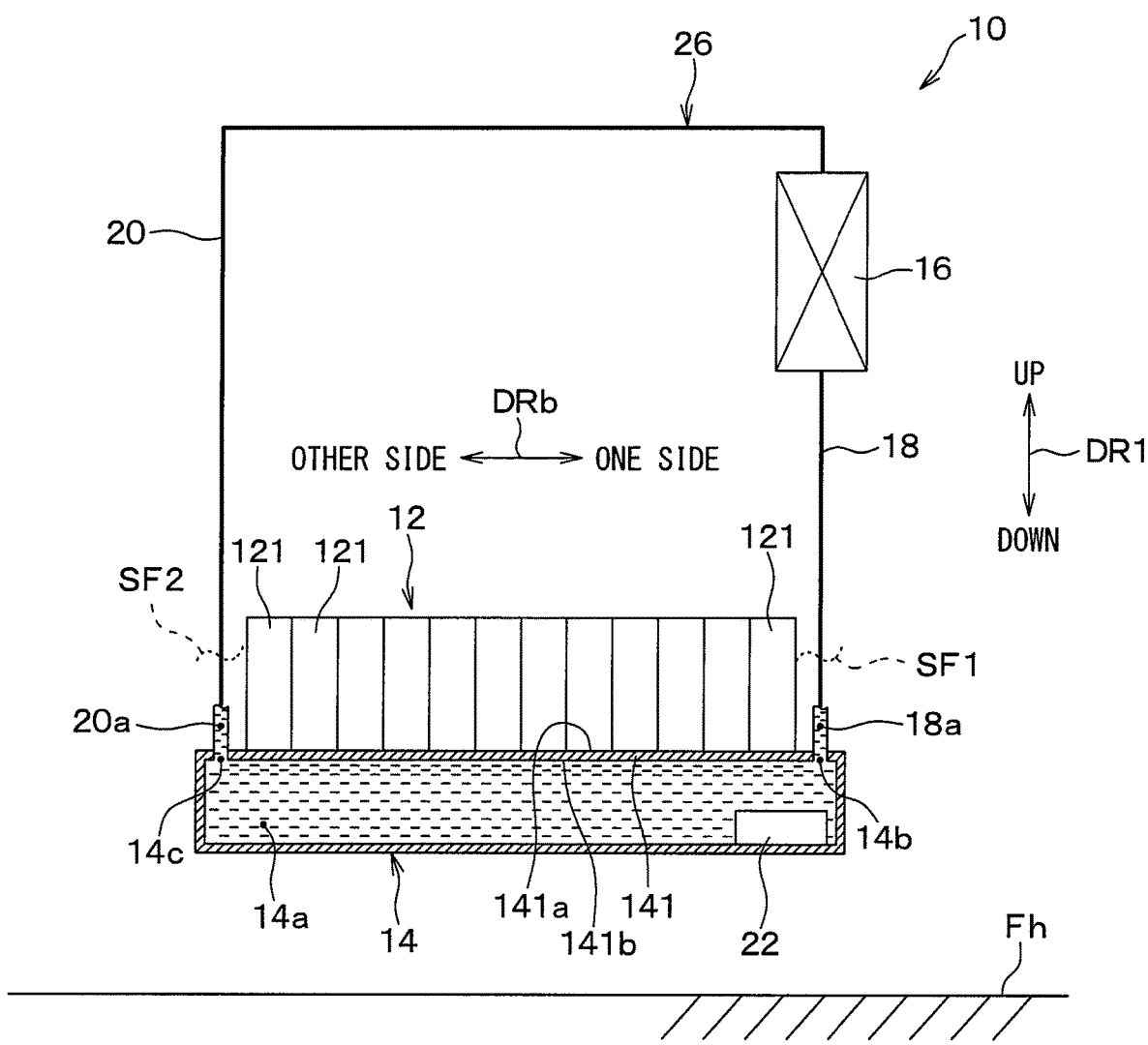
FIG. 11 is a schematic diagram to show a general configuration of a modification in which an arrangement of the bubble generator is changed inside the battery cooler in the first embodiment, and is a diagram corresponding to FIG. 1 of the first embodiment.

(13) In the respective embodiments described above, as shown in FIG. 1, the bubble generator 22 is provided on the outside of the battery cooler 14 but this is an example. For example, as shown in FIG. 11, the bubble generator 22 is allowed to be provided in the battery cooler 14. In this case, it is possible to arrange the bubble generator 22 so as to more easily cause the liquid-phase refrigerant in the battery cooler 14 to generate the bubbles 14*e* as compared with a case where the bubble generator 22 is provided on the outside of the battery cooler 14. In the example shown in FIG. 11, the bubble generator 22 is arranged on a bottom portion of the cooling chamber 14*a*.

(14) In the respective embodiments described above, the processing of each step of the flow chart shown in FIG. 2 and FIG. 6 is realized by a computer program but is allowed to be configured by a hard logic.

The present disclosure is not limited to the embodiments described above but includes also various modifications and transformations within an equivalent scope. Further, the respective embodiments described above are not unrelated to each other but can be combined with each other as appropriate except where a combination of them is clearly impossible.

Further, in the respective embodiments described above, needless to say, elements configuring the embodiment are not necessarily essential except where the elements are specified to be especially essential and except where the elements are clearly essential in principle. Further, in the respective embodiments described above, in a case where numerical values such as a number, a numerical value, an amount, and a range of the constituent element of the embodiment refer, the numerical values are not limited to the specified numerical values, except where the numerical values are specified to be especially essential or except where the numerical values are clearly limited to the specified numbers in principle.

Still further, in the respective embodiments described above, when a material, a shape, and a position relation of the constituent element or the like are referred to, the material, the shape, and the position relation are not limited to the specified material, the specified shape, and the specified position relation, except where the material, the shape, and the position relation are specified to be especially essential or except where the material, the shape, and the position relation are limited to a specified material, a specified shape, and a specified position relation in principle.

According to a first aspect shown in a part or all of the embodiments described above, a device temperature regulator in which a working fluid circulates is for regulating a temperature of a target device by a phase change between a liquid phase and a gas phase of the working fluid. The device temperature regulator includes a heat absorber that causes the working fluid to absorb heat from the target device so as to evaporate the working fluid, a heat radiator that is arranged above the heat absorber and that causes the working fluid to radiate heat so as to condense the working fluid, a forward passage in which a forward flow passage is formed to cause the working fluid to flow to the heat absorber from the heat radiator, a backward passage in which a backward flow passage is formed to cause the working fluid to flow to the heat radiator from the heat absorber, a bubble generator that generates a bubble in the working fluid collecting in the heat absorber and having the liquid phase, and a controller configured to cause the bubble generator to generate the bubble when a circulation flow rate of the working fluid circulating in a fluid circulation circuit, configured of the heat radiator, the forward passage, the heat absorber and the backward passage, is a specified flow rate or less.

As described above, the device temperature regulator is provided with the bubble generator to generate the bubble in the working fluid collecting in the heat absorber and being the liquid phase. Then, in a case where the circulation flow rate of the working fluid circulating in the fluid circulation circuit is the specified flow rate or less, the controller of the device temperature regulator causes the bubble generator to generate the bubbles. Thus, it is possible to appropriately activate a cooling of the target device by the fluid circulation circuit configured as the thermosiphon.

Further, according to a second aspect, in a case where the predetermined precondition is satisfied and where the circulation flow rate of the working fluid is the specified flow rate or less, the controller causes the bubble generator to generate the bubbles.

Further, according to a third aspect, in a case where the precondition described above is satisfied and where the circulation flow rate of the working fluid is the specified flow rate or less, the controller causes the bubble generator to temporarily generate the bubbles. Thus, the generation of the bubbles by the bubble generator can be used as a trigger to start circulating the working fluid in the fluid circulation circuit. In short, the bubble generator can be used as an activation device to start circulating the working fluid. It is possible to avoid the generation of the bubbles by the bubble generator from being unnecessarily continued after the working fluid starts to circulate.

Further, according to a fourth aspect, in a case where the controller causes the bubble generator to start generating the bubbles and where the circulation flow rate of the working fluid becomes more than the specified circulation flow rate, the controller stops generating the bubbles by the bubble generator to thereby cause the bubble generator to temporarily generate the bubbles. Thus, it is possible to avoid the generation of the bubbles by the bubble generator from being unnecessarily continued after the working fluid starts to circulate.

Further, according to a fifth aspect, in a case where the specified time passes after the controller causes the bubble generator to start generating the bubbles, the controller stops the generation of the bubbles by the bubble generator to thereby cause the bubble generator to temporarily generate the bubbles. Thus, also in this way, it is possible to avoid the generation of the bubbles by the bubble generator from being unnecessarily continued after the working fluid starts to circulate.

Further, according to a sixth aspect, the case where the precondition described above is satisfied is a case where the heat absorber is inclined by the specified angle or more with respect to the predetermined reference posture. Thus, even in a state where the heat absorber is inclined, the generation of the bubbles in the heat absorber can push up the liquid surface in the heat absorber and can cause the working fluid of the liquid phase to flow to the whole in the heat absorber. As a result, it is possible to sufficiently equalize the temperature of the whole of the target device.

Further, according to a seventh aspect, the case where the precondition described above is satisfied is a case where the temperature of the target device becomes the specified temperature threshold value or more. Thus, according to the need of cooling the target device, with the generation of the bubbles caused by the bubble generator as a trigger, the boiling of the working fluid can be accelerated in the heat absorber.

Further, according to an eighth aspect, the bubble generator is arranged at a position, which is closer to the inflow port than the outflow port, of the heat absorber. Here, even when the circulation flow rate of the working fluid is the specified flow rate or less, near the inflow port of the heat absorber, the condensed liquid returns slightly to the heat absorber from the heat radiator in some cases, and in this case, the condensed liquid which returns evaporates to thereby cool the target device. Thus, in the case of assuming that, for example, the heat absorber is inclined to thereby cause the working fluid of the gas phase to collect unevenly on the outflow port side or on the inflow port side in the heat absorber, an advantage of starting the circulation of the working fluid becomes larger in a case where the working fluid of the gas phase collects unevenly on the outflow port side than in a case where the working fluid of the gas phase collects unevenly on the inflow port side. Then, the case where the working fluid of the gas phase collects unevenly on the outflow port side is, in other words, a case where the working fluid of the liquid phase collects unevenly on the inflow port side. From this, the bubble generator can be arranged at a position in which a bubble generating operation can be easily applied to the working fluid of the liquid phase under the situation where the advantage of starting the circulation of the working fluid becomes large, that is, at a position close to the inflow port.

Further, according to a ninth aspect, the bubble generator is provided in the heat absorber. Thus, the bubble generator can be arranged so as to easily cause the working fluid of the liquid phase in the heat absorber to generate the bubbles as compared with a case where the bubble generator is provided on the outside of the heat absorber.

Further, according to a tenth aspect, the forward passage includes the bubble-generator arrangement part in which the bubble generator is provided and the lower arrangement part arranged lower than the bubble-generator arrangement part. Then, the lower arrangement part is arranged closer to the heat radiator side than the bubble-generator arrangement part in a working fluid flow of the forward flow passage. Thus, by arranging the bubble generator at a portion other than the heat absorber, it is possible to generate the bubbles in the working fluid collecting in the heat absorber and having the liquid phase. Then, it is possible to prevent the bubbles, which are generated in the bubble-generator arrangement part by the bubble generator, from flowing to the heat radiator side in the forward flow passage, that is, the bubbles from flowing backward in the forward flow passage.

Further, according to an eleventh aspect, the forward passage includes the bubble-generator arrangement part, in which the bubble generator is provided, and the check valve, which allows the working fluid flow to the heat absorber from the heat radiator and which suppresses the working fluid flow from flowing backward. The check valve is arranged closer to the heat radiator side than the bubble-generator arrangement part in the working fluid flow in the forward flow passage. Thus, by arranging the bubble generator at a portion other than the heat absorber, it is possible to generate the bubbles in the working fluid collecting in the heat absorber and having the liquid phase. Then, it is possible to prevent the bubbles, which are generated in the bubble-generator arrangement part by the bubble generator, from flowing to the heat radiator side in the forward flow passage.

Further, according to a twelfth aspect, the bubble generator heats the working fluid of the liquid phase to thereby generate the bubbles. Thus, for example, a heater for heating the working fluid of the liquid phase can be used for cooling the target device which utilizes the boiling of the working fluid.

Further, according to a thirteenth aspect, the bubble generator applies the ultrasonic vibration to the working fluid of the liquid phase. Thus, the target device can be cooled as appropriate without heating the working fluid in the heat absorber.

According to a fourteenth aspect of the present disclosure, a device temperature regulator includes a heat absorber that causes the working fluid to absorb heat from the target device so as to evaporate the working fluid, a heat radiator that is arranged above the heat absorber and that causes the working fluid to radiate heat, so as to condense the working fluid, a forward passage in which a forward flow passage is formed to cause the working fluid to flow to the heat absorber from the heat radiator, a backward passage in which a backward flow passage is formed to cause the working fluid to flow to the heat radiator from the heat absorber, a bubble generator that generates a bubble in the working fluid collecting in the heat absorber and having the liquid phase, and a controller configured to cause the bubble generator to generate the bubble, when a portion on an upstream side of the working fluid of the heat absorber is the liquid phase and a portion on a downstream side of the working fluid of the heat absorber is the gas phase.

Even in this way, it is possible to appropriately activate a cooling of the target device by the fluid circulation circuit configured as the thermosiphon.

What is claimed is:

1. A device temperature regulator in which a working fluid circulates and which regulates a temperature of a target device by a phase change between a liquid phase and a gas phase of the working fluid, the device temperature regulator comprising:
   a heat absorber that causes the working fluid to absorb heat from the target device, so as to evaporate the working fluid;
   a heat radiator that is arranged above the heat absorber and that causes the working fluid to radiate heat, so as to condense the working fluid;
   a forward passage in which a forward flow passage is provided, the forward flow passage causing the working fluid to flow to the heat absorber from the heat radiator;
   a backward passage in which a backward flow passage is provided, the backward flow passage causing the working fluid to flow to the heat radiator from the heat absorber;
   a bubble generator configured to generate a bubble in the working fluid collecting in the heat absorber and having the liquid phase; and
   a controller configured to cause the bubble generator to generate the bubble (i) when the working fluid circulates in a fluid circulation circuit made of the heat radiator, the forward passage, the heat absorber and the backward passage, to cool the target device, and (ii) when a circulation flow rate of the working fluid circulating in the fluid circulation circuit is a specified flow rate or less.

2. The device temperature regulator according to claim 1, wherein
   the controller causes the bubble generator to generate the bubble, in a case where a precondition is satisfied and where the circulation flow rate of the working fluid is the specified flow rate or less.

3. The device temperature regulator according to claim 2, wherein
   the controller causes the bubble generator to temporarily generate the bubble, in a case where the precondition is satisfied and where the circulation flow rate of the working fluid is the specified flow rate or less.

4. The device temperature regulator according to claim 3, wherein
   when the circulation flow rate of the working fluid becomes more than the specified flow rate in a case where the controller causes the bubble generator to start generating the bubble, the controller causes the bubble generator to stop generating the bubble.

5. The device temperature regulator according to claim 3, wherein
   when a predetermined time passes after the bubble generator starts generating the bubble, the controller causes the bubble generator to stop generating the bubble.

6. The device temperature regulator according to claim 2, wherein
   the case where the precondition is satisfied is a case where the heat absorber is inclined by a specified angle or more with respect to a predetermined reference posture.

7. The device temperature regulator according to claim 2, wherein the case where the precondition is satisfied is a case where the temperature of the target device becomes a specified temperature threshold value or more.

8. The device temperature regulator according to claim 1, wherein
the heat absorber is provided with an inflow port causing the forward flow passage to communicate with an interior of the heat absorber, and an outflow port causing the backward flow passage to communicate with the interior of the heat absorber, and
the bubble generator is arranged at a position closer to the inflow port than the outflow port of the heat absorber.

9. The device temperature regulator according to claim 8, wherein the bubble generator is provided in the heat absorber.

10. The device temperature regulator according to claim 1, wherein
the forward passage includes a bubble-generator arrangement part in which the bubble generator is provided, and a lower arrangement part arranged below the bubble-generator arrangement part, and
the lower arrangement part is arranged closer to a side of the heat radiator than the bubble-generator arrangement part in a working fluid flow in the forward flow passage.

11. The device temperature regulator according to claim 1, wherein
the forward passage includes a bubble-generator arrangement part in which the bubble generator is provided, and a check valve that allows the working fluid to flow to the heat absorber from the heat radiator while inhibiting the working fluid from flowing backward, and
the check valve is arranged closer to a side of the heat radiator than the bubble-generator arrangement part in a working fluid flow in the forward flow passage.

12. The device temperature regulator according to claim 1, wherein
the bubble generator heats the working fluid of the liquid phase to generate the bubble.

13. The device temperature regulator according to claim 1, wherein
the bubble generator applies an ultrasonic vibration to the working fluid of the liquid phase to generate the bubble.

14. A device temperature regulator in which a working fluid circulates and which regulates a temperature of a target device by a phase change between a liquid phase and a gas phase of the working fluid, the device temperature regulator comprising:
a heat absorber that causes the working fluid to absorb heat from the target device, so as to evaporate the working fluid;
a heat radiator that is arranged above the heat absorber and that causes the working fluid to radiate heat, so as to condense the working fluid;
a forward passage in which a forward flow passage is provided, the forward flow passage causing the working fluid to flow to the heat absorber from the heat radiator;
a backward passage in which a backward flow passage is provided, the backward flow passage causing the working fluid to flow to the heat radiator from the heat absorber;
a bubble generator configured to generate a bubble in the working fluid collecting in the heat absorber and having the liquid phase; and
a controller configured to cause the bubble generator to generate the bubble, (i) when the working fluid circulates in a fluid circulation circuit made of the heat radiator, the forward passage, the heat absorber and the backward passage, to cool the target device, and (ii) when an upstream side area of the working fluid within the heat absorber is the liquid phase and a downstream side area of the working fluid within the heat absorber is the gas phase.

15. A device temperature regulator for regulating a temperature of a target device by a phase change between a liquid phase and a gas phase of the working fluid, the device temperature regulator comprising:
a heat absorber disposed in a fluid circulation circuit in which the working fluid circulates, to evaporate the working fluid by absorbing heat from the target device;
a heat radiator disposed in the fluid circulation circuit above the heat absorber and configured to condense the working fluid by radiating heat;
a forward passage through which the working fluid flows to the heat absorber from the heat radiator in the fluid circulation circuit;
a backward passage through which the working fluid flows to the heat radiator from the heat absorber in the fluid circulation circuit;
a heater disposed at the heat absorber to heat the working fluid, the heater being configured to generate a bubble in the working fluid of the liquid phase in the heat absorber by heating the working fluid; and
a controller configured to cause the heater to generate the bubble, when at least one of a condition where a circulation flow rate of the working fluid circulating in the fluid circulation circuit is a specified flow rate or less, a condition where the heat absorber is inclined by a specified angle or more with respect to a reference posture, or a condition where an upstream side area of the working fluid within the heat absorber is the liquid phase and a downstream side area of the working fluid within the heat absorber is the gas phase, is satisfied, in a case where the working fluid circulates in a fluid circulation circuit made of the heat radiator, the forward passage, the heat absorber and the backward passage, to cool the target device.

16. The device temperature regulator according to claim 15, wherein
the controller causes the heater to stop generating the bubble, when the circulation flow rate of the working fluid becomes more than the specified flow rate in a case where the controller causes the heater to start generating the bubble.

17. The device temperature regulator according to claim 15, wherein
when a predetermined time passes after the heater starts generating the bubble, the controller causes the heater to stop generating the bubble.

18. The device temperature regulator according to claim 1, wherein
the heat absorber is provided with an inflow port causing the forward flow passage to communicate with an interior of the heat absorber, and an outflow port causing the backward flow passage to communicate with the interior of the heat absorber, and
the bubble generator is provided outside of the heat absorber at a lower portion of the heat absorber and arranged at a position closer to the inflow port than the outflow port of the heat absorber.

19. The device temperature regulator according to claim 1, wherein
- the heat absorber is provided with an inflow port causing the forward flow passage to communicate with an interior of the heat absorber, and an outflow port causing the backward flow passage to communicate with the interior of the heat absorber,
- the forward passage includes a bubble-generator arrangement part arranged at a position closer to the inflow port than the outflow port of the heat absorber and a lower arrangement part arranged closer to the heat radiator than the bubble-generator arrangement part in a working fluid flow in the fluid circulation circuit, and
- the bubble generator is disposed between the inflow port and the lower arrangement part surrounding an outside of the bubble-generator arrangement part.

20. The device temperature regulator according to claim 1, wherein
- the heat absorber is provided with an inflow port causing the forward flow passage to communicate with an interior of the heat absorber, and an outflow port causing the backward flow passage to communicate with the interior of the heat absorber,
- the forward passage includes a bubble-generator arrangement part and a check valve arranged closer to the heat radiator than the bubble-generator arrangement part in a working fluid flow in the fluid circulation circuit, and
- the bubble generator is disposed between the inflow port and the check valve surrounding an outside of the bubble-generator arrangement part.

* * * * *